(12) United States Patent
Girt et al.

(10) Patent No.: US 8,158,880 B1
(45) Date of Patent: *Apr. 17, 2012

(54) THIN-FILM PHOTOVOLTAIC STRUCTURES INCLUDING SEMICONDUCTOR GRAIN AND OXIDE LAYERS

(75) Inventors: Erol Girt, San Jose, CA (US); Mariana Rodica Munteanu, Santa Clara, CA (US)

(73) Assignee: AQT Solar, Inc., Sunnyvale, CA (US)

( * ) Notice: Subject to any disclaimer, the term of this patent is extended or adjusted under 35 U.S.C. 154(b) by 463 days.

This patent is subject to a terminal disclaimer.

(21) Appl. No.: 12/016,172

(22) Filed: Jan. 17, 2008

Related U.S. Application Data

(63) Continuation-in-part of application No. 11/923,036, filed on Oct. 24, 2007, and a continuation-in-part of application No. 11/923,070, filed on Oct. 24, 2007.

(60) Provisional application No. 60/881,013, filed on Jan. 17, 2007.

(51) Int. Cl.
*H01L 31/00* (2006.01)
*H01L 27/14* (2006.01)

(52) U.S. Cl. ........ 136/255; 136/261; 257/431; 257/436; 257/465; 977/712; 977/720; 977/778; 977/948; 977/954

(58) Field of Classification Search .......... 136/243, 136/258, 260, 263, 264, 255, 261; 257/292, 257/293, 431, 436, 465; 977/712, 720, 778, 977/948, 954
See application file for complete search history.

(56) References Cited

U.S. PATENT DOCUMENTS

| | | | | |
|---|---|---|---|---|
| 4,379,943 A | * | 4/1983 | Yang et al. | 136/249 |
| 4,713,493 A | | 12/1987 | Ovshinsky | |
| 5,252,139 A | | 10/1993 | Schmitt | |
| 5,482,570 A | | 1/1996 | Saurer et al. | |
| 5,720,827 A | * | 2/1998 | Simmons | 136/250 |
| 5,913,986 A | * | 6/1999 | Matsuyama | 136/255 |
| 6,323,417 B1 | | 11/2001 | Gillespie | |
| 6,902,835 B2 | | 6/2005 | Hikosaka et al. | |
| 6,995,371 B2 | | 2/2006 | Garber et al. | 250/330 |
| 7,087,831 B2 | | 8/2006 | Den et al. | 136/250 |
| 7,192,664 B1 | | 3/2007 | Wu et al. | |
| 7,226,674 B2 | | 6/2007 | Koda et al. | |
| 7,235,314 B2 | | 6/2007 | Chen et al. | |
| 7,696,429 B2 | | 4/2010 | Strobl | |
| 2002/0050289 A1 | | 5/2002 | Wada et al. | 136/256 |
| 2004/0003839 A1 | * | 1/2004 | Curtin | 136/250 |
| 2004/0157354 A1 | | 8/2004 | Kuriyama | |
| 2004/0187912 A1 | * | 9/2004 | Takamoto et al. | 136/255 |
| 2005/0006714 A1 | | 1/2005 | Graetzel et al. | |

(Continued)

OTHER PUBLICATIONS

Lee, J. "Comparison of CdS films deposited by different techniques: Effects on CdTe solar cell", Applied Surface Science, 252 Apr. 2005, 1398-1403.*

(Continued)

*Primary Examiner* — Basia Ridley
*Assistant Examiner* — Devina Pillay
(74) *Attorney, Agent, or Firm* — Baker Botts L.L.P.

(57) ABSTRACT

Photovoltaic structures for the conversion of solar irradiance into electrical free energy. In a particular implementation, a photovoltaic cell includes a granular semiconductor and oxide layer with nanometer-size absorber semiconductor grains surrounded by a matrix of oxide. The semiconductor and oxide layer may be disposed between electron and hole conducting layers. In some implementations, multiple semiconductor and oxide layers can be deposited.

30 Claims, 18 Drawing Sheets

U.S. PATENT DOCUMENTS

| | | |
|---|---|---|
| 2005/0061364 A1 | 3/2005 | Peumans |
| 2005/0121068 A1 | 6/2005 | Sager |
| 2005/0155641 A1 | 7/2005 | Fafard .......................... 136/249 |
| 2006/0008580 A1 | 1/2006 | Nelles et al. .................. 427/162 |
| 2006/0086385 A1 | 4/2006 | Nakano et al. ................. 136/255 |
| 2006/0207647 A1* | 9/2006 | Tsakalakos et al. ........... 136/256 |
| 2007/0111368 A1 | 5/2007 | Zhang |
| 2007/0240757 A1 | 10/2007 | Ren |
| 2010/0043872 A1 | 2/2010 | Richter |
| 2010/0044675 A1 | 2/2010 | Richter |
| 2010/0047595 A1 | 2/2010 | Harkness, IV |
| 2010/0051095 A1 | 3/2010 | Richter |

OTHER PUBLICATIONS

Yin et al, "Fabrication of highly ordered metallic nanowire array by electrodeposition", Applied Physics Letters, Vo. 79 No. 7, p. 1039-1041, Aug. 2001.*

Ohlsson et al., "Size, shape, and position controlled GaAs whiskers", Applied Physics Letters, vol. 78 No. 20, p. 3335-3337, Nov. 2001.*

Lenzmann, F., et. al., "Substantial improvement of the photovoltaic characteristics of $TiO_2$ / $CuInS_2$ interfaces by the use of recombination barrier coatings," @ 2003 Elsevier B.V., www.elsevier.com/locate/tsf.

Grätzel, M., "Dye-sensitized solar cells," Journal of Photochemistry and Photobiology, @ 2003 Japanese Photochemistry Association, Published by Elsevier B.V., www.elsevier.com/locate/jphotochemrev.

Qi, D., et. al., "Efficient polymer-nanocrystal quantum-dot photodetectors," Applied Physics Letters 86, 093103 (2005), @ 2005 American Institute of Physics, Downloaded Sep. 4, 2007.

Shi, J.Z., et. al., "Influence of dual-Ru intermediate layers on magnetic properties and recording performance of $CoCrPt-SiO_2$ perpendicular recording media," Applied Physics Letters 87, 222503 (2005), @ 2005 American Institute of Physics, Downloaded Sep. 1, 2007.

Schaller, R., et. al., "Effect of electronic structure on carrier multiplication efficiency: Comparative study of PbSe and CdSe nanocrystals," Applied Physics Letters 87, 253102 (2005), @ 2005 American Institute of Physics, Downloaded Sep. 4, 2007.

Piramanayagam, S.N., et.al., "Advanced perpendicular recording media structure with a magnetic imtermediate layer," Applied Physics Letters 88, 092501 (2006), @ 2006 American Institue of Physics, Downloaded Sep. 1, 2007.

Park, S.H., et. al., "Effect of MgO and $Al_2O_3$ on the microstructure and magnetic properties of CoCrPt-oxide perpendicular recording media," Journal of Applied Physics 97, 10N106 (2005), @ 2005 American Institute of Physics, Downloaded Sep. 1, 2007.

Shimatsu, T., et. al., "$K_{u2}$ magnetic anisotropy term of $CoPtCr-SiO_2$ media for high density recording," Journal of Applied Physics 97, 10N111(2005), @ 2005 American Institue of Physics, Downloaded Sep. 1, 2007.

Mukai, R., et. al., "Signal-to-media-noise ratio improvement of $CoCrPt-SiO_2$, granular perpendicular media by stacked Ru underlayer," Journal of Applied Physics 97, 10N119 (2005), @ 2005 American Institute of Physics, Downloaded Sep. 1, 2007.

Takekuma, I., et. al., "Reduction in intermediate layer thickness of $CoCrPt-SiO_2$ perpendicular recording media by using $Ru-SiO_2$," Journal of Applied Physics 99, 08E713 (2006), @ 2006 American Institute of Physics, Downloaded Sep. 1, 2007.

Lee, H., et. al., "Effects of substrate bias on $CoCrPt-SiO_2$ magnetic recording media," Journal of Applied Physics 99, 08G910 (2006), @ 2006 American Institute of Physics, Downloaded Sep. 1, 2007.

Piramanayagam, S.N., "Perpendicular recording media for hard disk drives," Applied Physics Reviews—Focused Review, Journal of Applied Physics 102, 011301 (2007) @ 2007 American Institute of Physics, Downloaded Sep. 1, 2007.

Ho, M., "Quantum Dots and Ultra-Efficient Solar Cells?" ISIS Press Release Jan. 19, 2006.

NASA Glenn Research Cneter, "Quantum Dots Investigated for Solar Cells," last updated Jul. 25, 2002.

"Quantum Dots Enables New Advances in Solar Cell Industry," @ 2003-2007 Evident Technologies.

Ernst, K., et. al., "Solar cell with extremely thin absorber on highly structure substrate." Institute of Physics Publishing, Semicond. Sci. Technolo. 18 (2003) 475-479, @ 2003 IOP Publishing Ltd.

"Realization and Development of Extremely Thin Absorber Solid State Solar Cells (ETA)," Riso National Laboratory, Technical University of Denmark, Downloaded Feb. 4, 2008.

Tada, H., et. al., "All-solid-state Z-scheme in $CdS-Au-TiO_2$ three-component nanojunction system," Nature Materials, vol. 5, Oct. 2006, published online Sep. 10, 2006, @ 2006 Nature Publishing Group.

Nozik, A.J., "Exciton Multiplication and Relaxation Dynamics in Quantum Dots: Applications to Ultrahigh-Efficiency Solar Photon Conversion," Inorganic Chemistry, vol. 44, No. 20, 2005, published on Web Sep. 26, 2005, @ 2005 American Chemical Society.

"Dye-sensitized solar cells," Wikipedia, the free encyclopedia, Web page last modified Aug. 30, 2007.

*Notification of Transmittal of the International Search Report and the Written Opinion of the International Searching Authority* for International Application No. PCT/US 07/82405; 13 pages, May 8, 2008.

Office Action for U.S. Appl. No. 11/923,036, Sep. 16, 2009.

Office Action for U.S. Appl. No. 11/923,070 dated Mar. 2, 2010.

Office Action for U.S. Appl. No. 11/923,036 dated Apr. 14, 2010.

Wu, "A Novel Manufactuing Process for Fabricating CdS/CdTe Polycrystalline Thin-Film Solar Cells", NREL1CP-520-28368, *Conference Proceeding, 16th European Photovoltaic Solar Energy Conference and Exhibition*, pp. 1-4, May 2002.

Office Action for U.S. Appl. No. 11/923,036, Jun. 9, 2011.

Final Office Action for U.S. Appl. No. 11/923,036, Aug. 19, 2011.

Final Office Action for U.S. Appl. No. 11/923,070, Aug. 18, 2011.

Office Action for U.S. Appl. No. 11/923,070, Jun. 9, 2011.

* cited by examiner

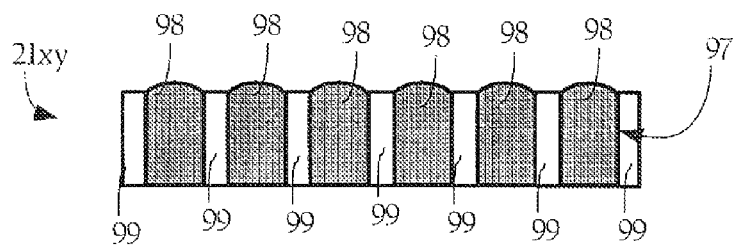
Fig._1e
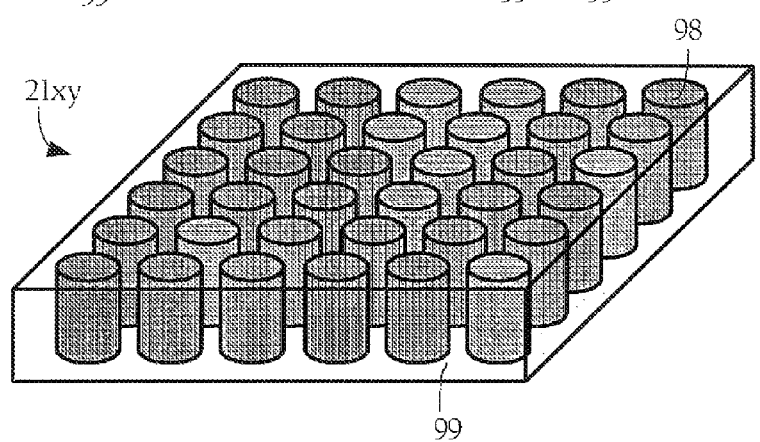
Fig._1f
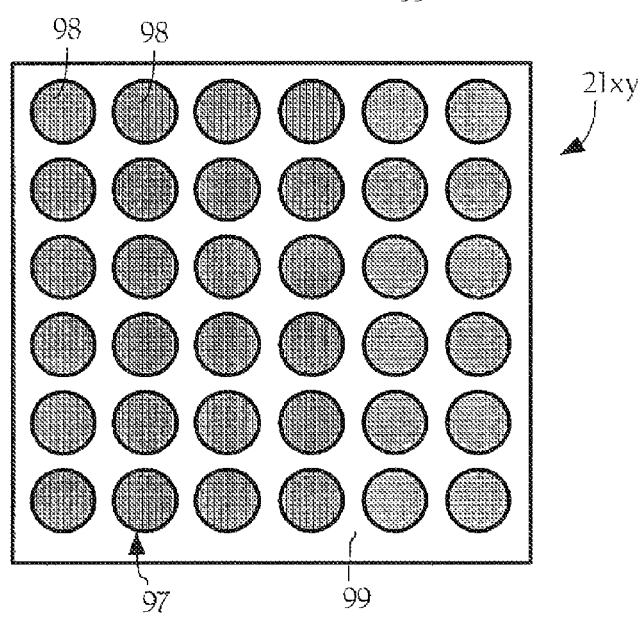
Fig._1g

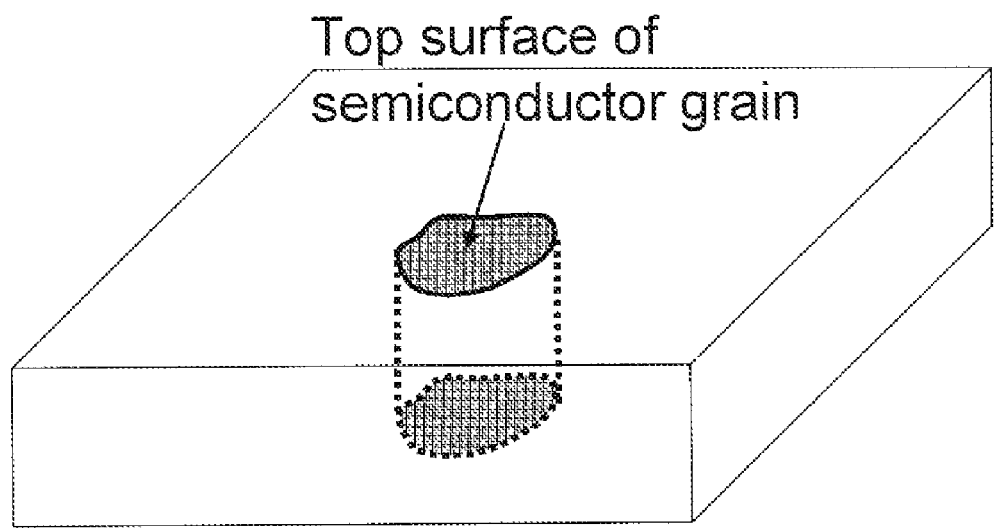
Fig._1i

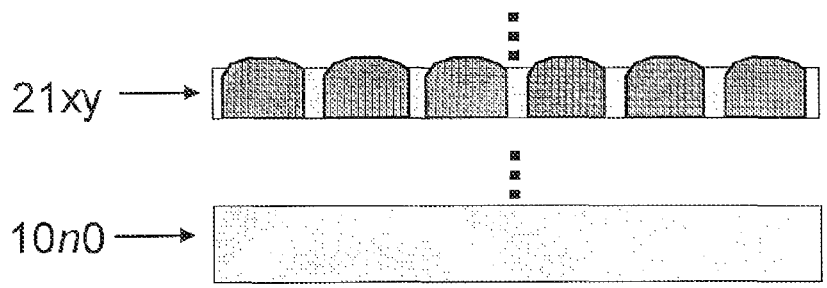
Fig._3a
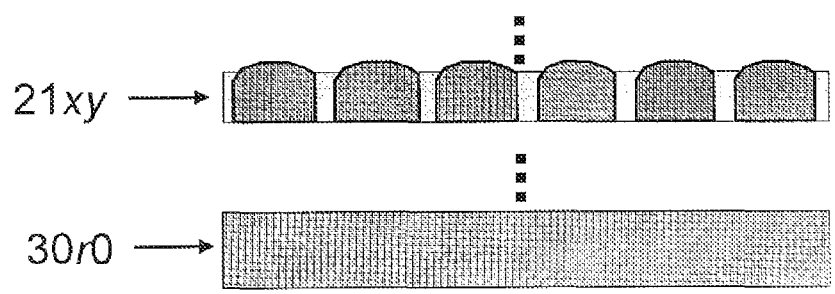
Fig._3b
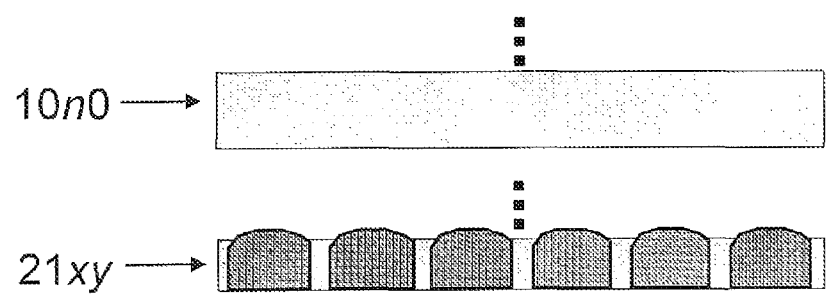
Fig._3c
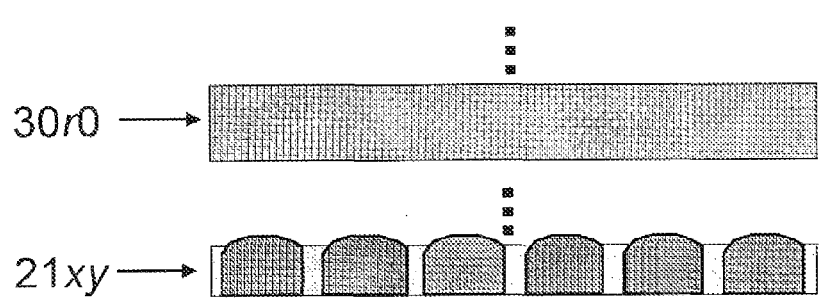
Fig._3d

21xy → 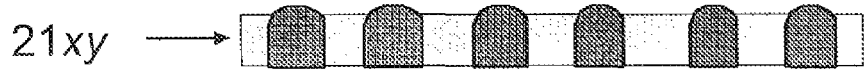
210y → 
Fig._4a
21t0 → 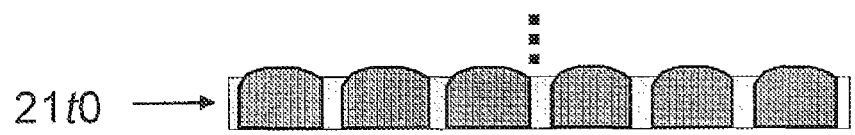
10n0 → 
Fig._4b
21s0 → 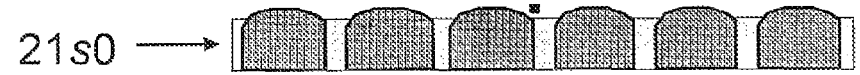
30r0 → 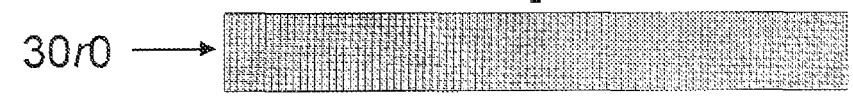
21m0 → 

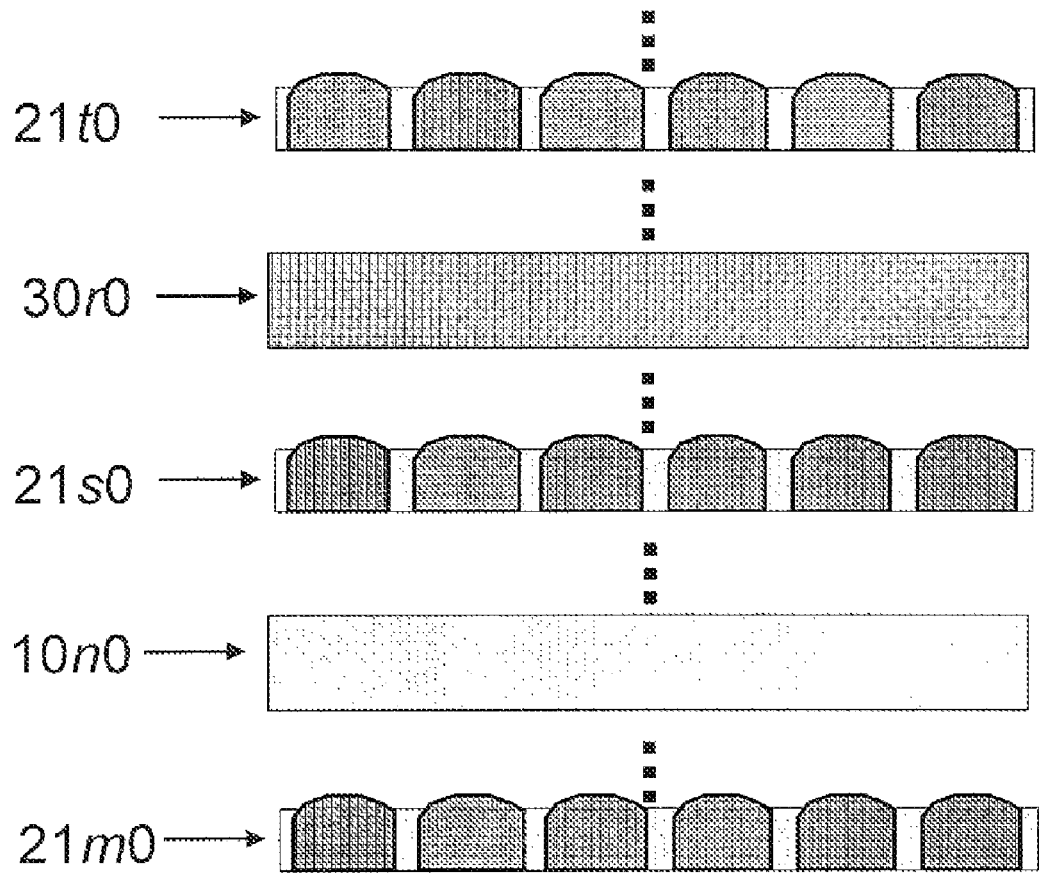
Fig._4c

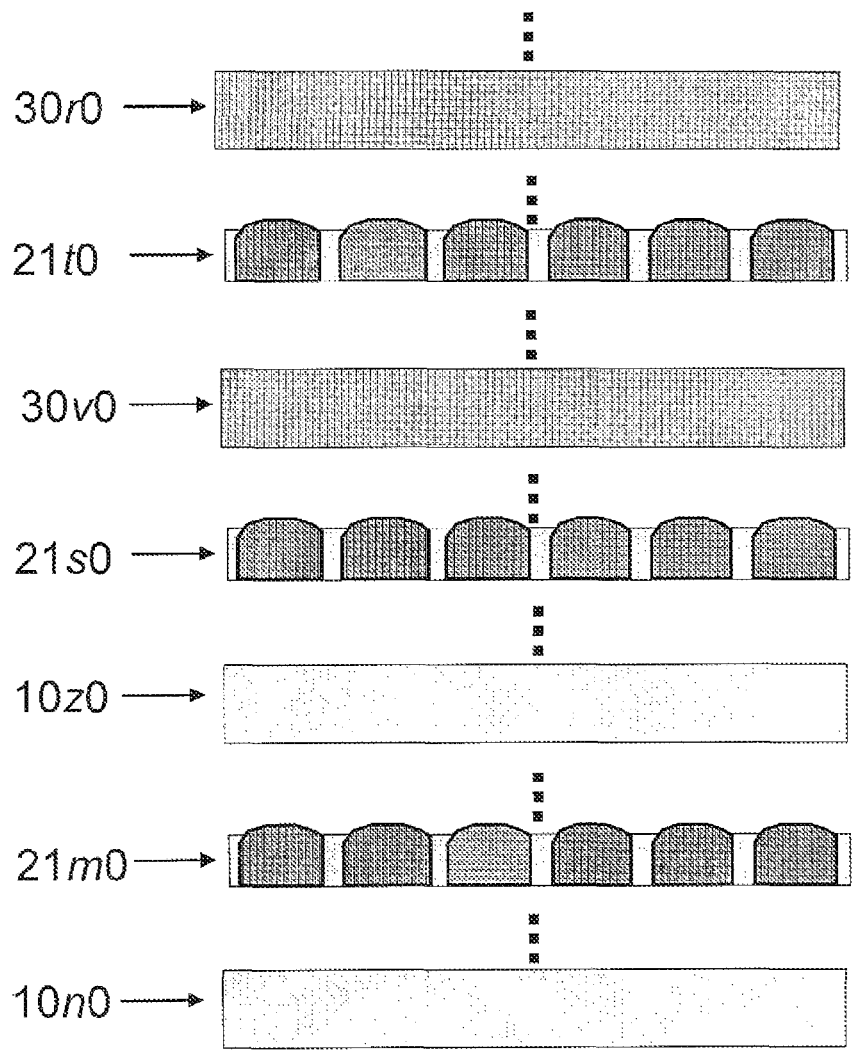
Fig._5b

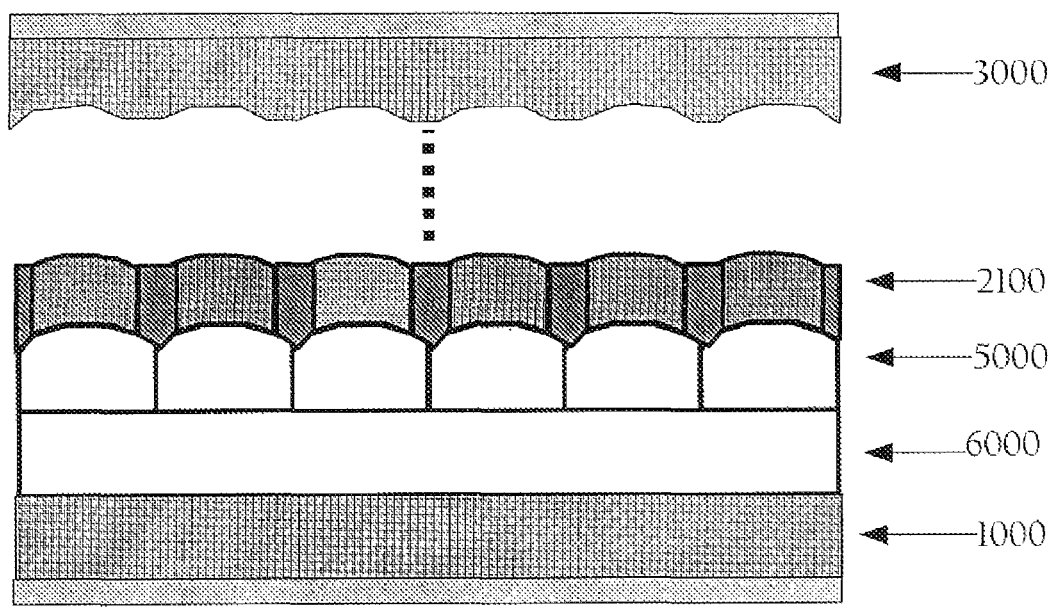
Fig._6

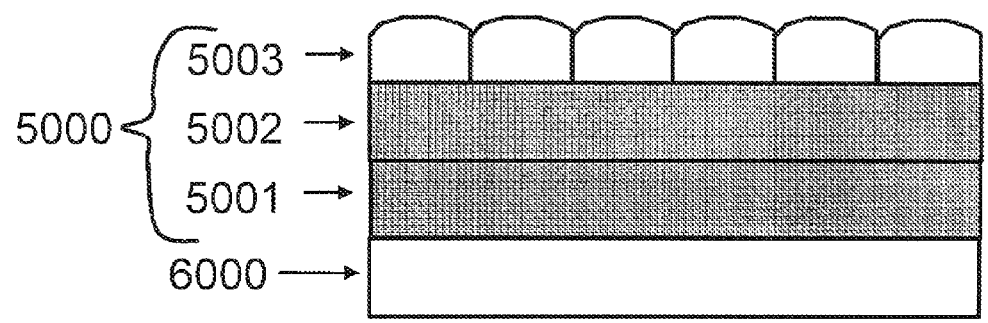
Fig._7a
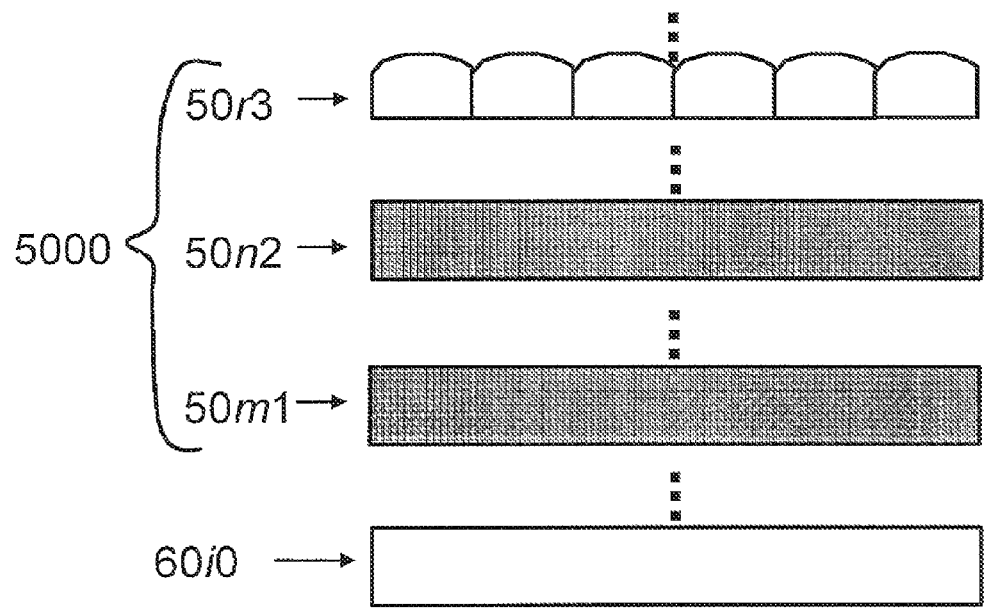
Fig._7b

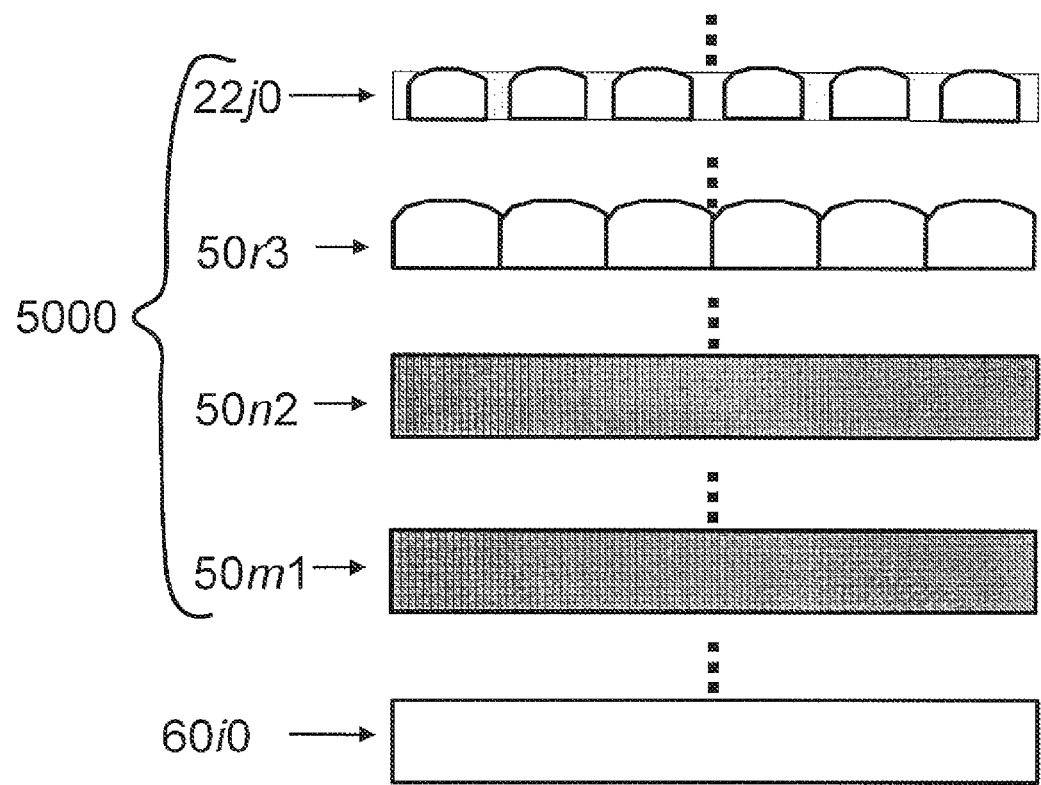
Fig._7c

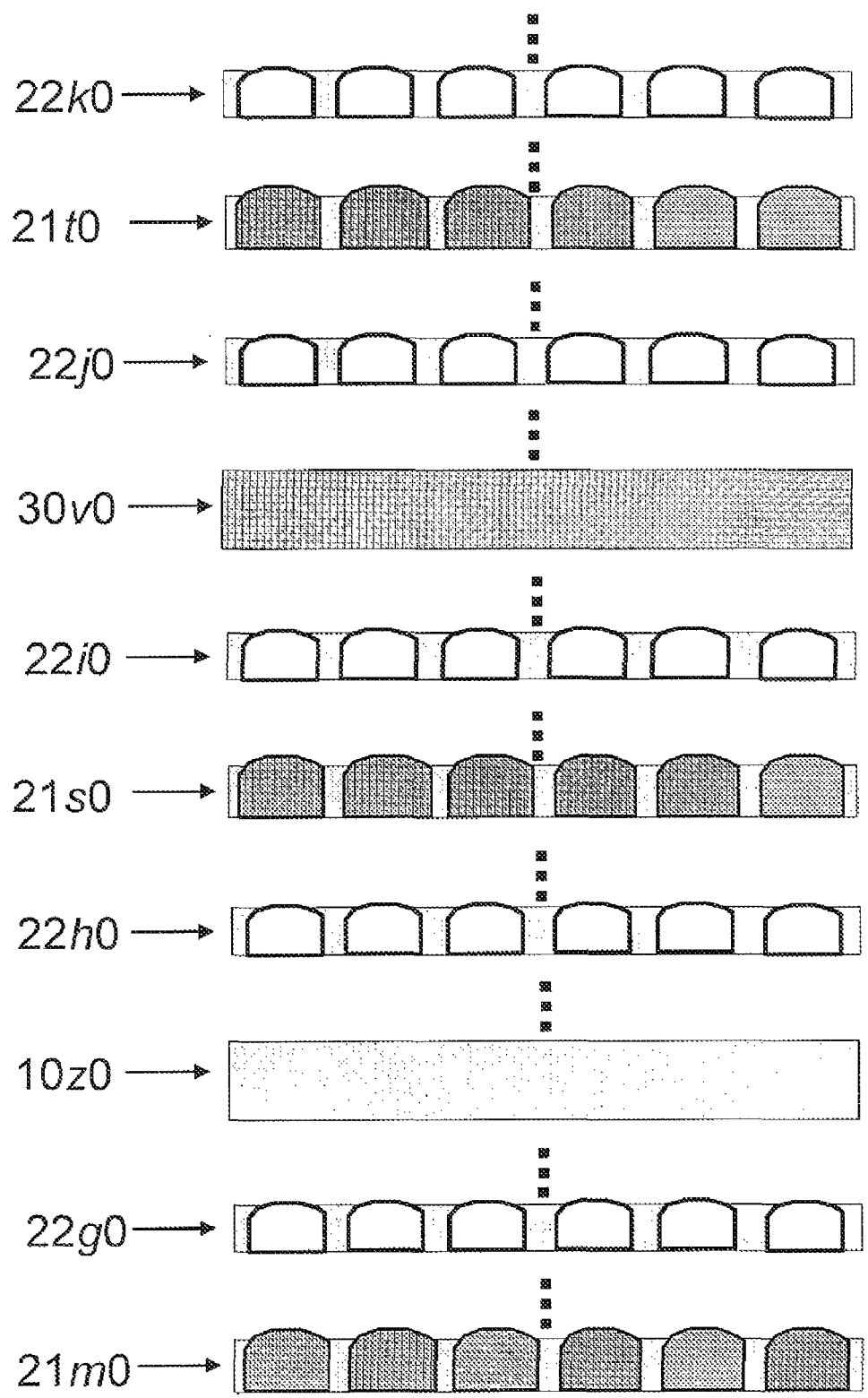
Fig._10a

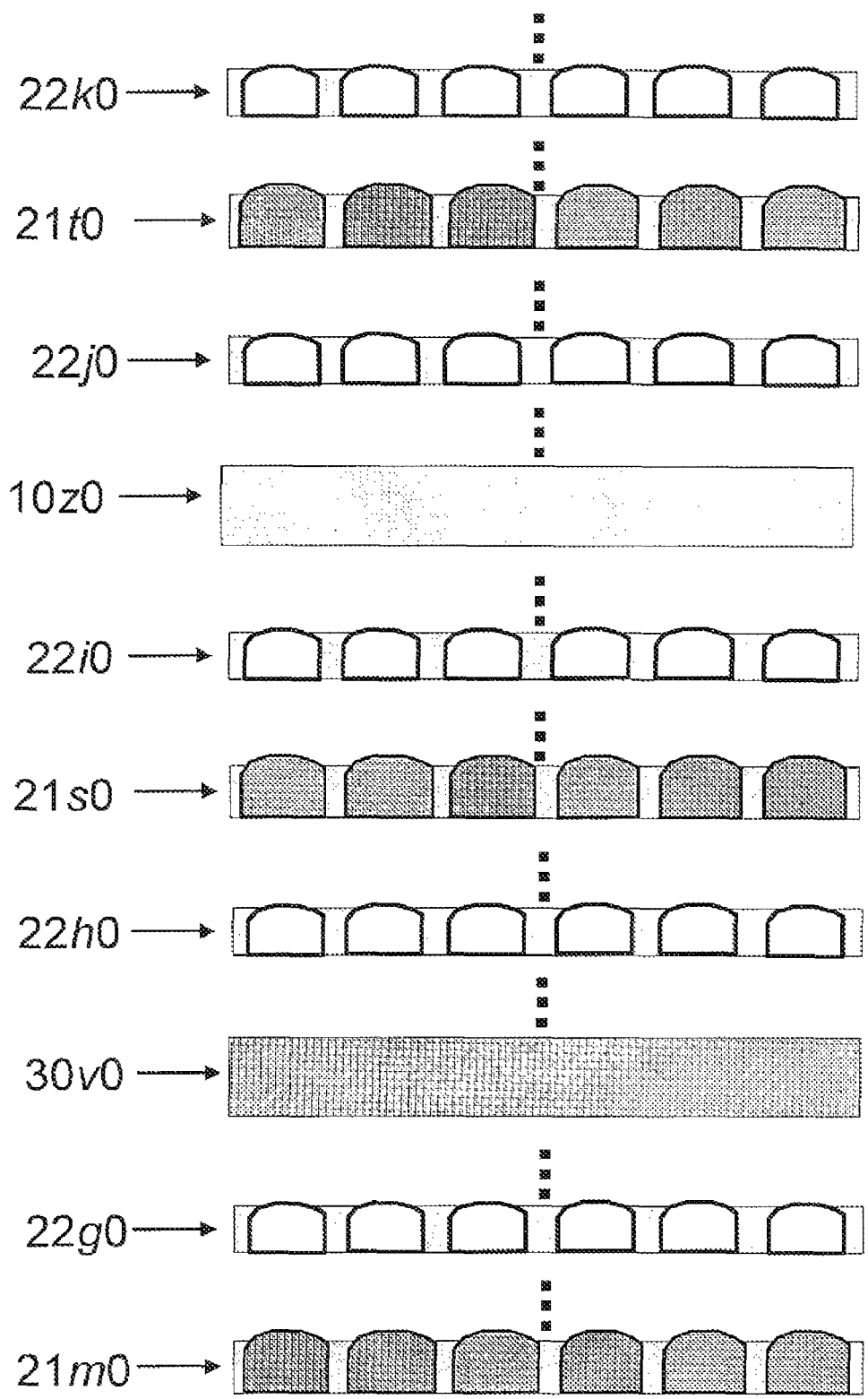
Fig._10b

THIN-FILM PHOTOVOLTAIC STRUCTURES INCLUDING SEMICONDUCTOR GRAIN AND OXIDE LAYERS

CROSS-REFERENCE TO RELATED APPLICATION(S)

The present application is a continuation-in-part of U.S. application Ser. No. 11/923,036, filed Oct. 24, 2007, and a continuation-in-part of U.S. application Ser. No. 11/923,070, filed Oct. 24, 2007, both of which are incorporated by reference herein in their entirety for all purposes. The present application also claims priority to U.S. Provisional Application Ser. No. 60/881,013, filed Jan. 17, 2007.

TECHNICAL FIELD

The present disclosure generally relates to photovoltaics.

BACKGROUND

The maximum thermodynamic efficiency for the conversion of non-concentrated solar irradiance into electrical free energy for a single-band semiconductor absorber is approximately 31 percent [W. Shockley, H. J. Queisser, J., Appl. Phys., 32, 510 (1961)]. This efficiency is attainable in semiconductors with band gap energies ranging from 1.25 to 1.45 electronvolts (eV). For semiconductors, band gap generally refers to the energy difference between the top of the valence band and the bottom of the conduction band. The solar spectrum, however, contains photons with energies ranging from about 0.5 to about 3.5 eV. Photons with energies below the semiconductor band gap energy, $E_g$, are not absorbed. On the other hand, photons with energies above the band gap energy create charge carriers with a total excess kinetic energy, $E_k(\text{excess}) = h\nu - E_g$, where $h\nu$ is the photon energy. A significant factor limiting the conversion efficiency to 31% is that the excess kinetic energy (absorbed photon energy above the semiconductor band gap energy) $E_k(\text{excess})$ is lost as heat through electron-phonon scattering. "Hot" electrons and holes that are created by absorption of solar photons with energies larger than the band gap energy will relax to their respective band edges.

For a single-band-gap semiconductor absorber there are two ways to extract energy from hot carriers before they relax to the band edge. One method produces an enhanced photovoltage, and the other method produces an enhanced photocurrent. The former method involves extraction of hot carriers from a semiconductor absorber before they relax to their respective band edges. Extracting energy from hot carriers, before they relax to the band edge, is possible if the relaxation rate of hot carriers to their respective band edges is slowed. In the latter method, hot carriers produce two or more electron-hole pairs—so-called impact ionization.

P-n junction solar cells are the most common solar cells, including a layer of n-type semiconductor in direct contact with a layer of p-type semiconductor. If a p-type semiconductor is placed in intimate contact with a n-type semiconductor, then a diffusion of electrons occurs from the region of high electron concentration (the n-type side of the junction) into the region of low electron concentration (p-type side of the junction). The diffusion of carriers does not happen indefinitely, however, because of an opposing electric field created by this charge imbalance. The electric field established across the p-n junction induces separation of charge carriers that are created as result of photon absorption.

Dye-sensitized solar cells and quantum dot-sensitized solar cells are two next generation solar technologies. In dye-sensitized solar cells, dye molecules are chemisorbed onto the surface of 10 to 30 nanometer (nm) size titanium oxide ($TiO_2$) particles that have been sintered into high porous nanocrystalline 10 to 20 μm thick $TiO_2$ films. Upon the photo excitation of dye molecules, electrons are injected from the excited state of dye into the conducting band of the $TiO_2$ creating a charge separation and producing photovoltaic effect. The original state of the dye is subsequently restored by electron donation from the electrolyte, usually an organic solvent containing redox system, such as the iodide/triiodide couple. It is generally accepted that, in dye-sensitized solar cells, the electron transport through the oxide is predominantly governed by diffusion, because the highly conductive electrolyte screens the interior of the cells from any applied electric field.

In quantum dot-sensitized solar cells, semiconductor particles with sizes below 10 nm (so-called quantum dots) take the role of the dye molecules as absorbers. In these solar cells, the hot carriers may produce two or more electron-hole pairs, so-called impact ionization, increasing efficiency of these solar cells. Quantum dot-sensitized solar cells offer several other advantages. The band gap energies and thereby the absorption ranges are adjustable through quantum dot size or composition. Furthermore, compared to organic dyes, quantum dot sensitization offers improved stability, since the surface of the semiconductor quantum dot can be modified to improve its photostability.

A noted drawback of both dye-sensitized and quantum dot-sensitized solar cells is long term stability due to the presence of electrolyte. In order to improve stability of quantum dot-sensitized solar cells, the redox electrolyte in these cells can be replaced with a solid hole-conducting material, such as spiro-OMeTAD, or a p-type semiconductor. The former is called a solid state dye-sensitized solar cell, if an absorber is a dye molecule, or a solid state quantum dot-sensitized solar cell, if an absorber is a quantum dot. The latter solar cell, including a p-type semiconductor, is called an extremely thin absorber (ETA) solar cell. In this solar cell, a porous nanocrystalline $TiO_2$ film is covered with a p-type semiconductor absorber using an atomic layer deposition technique, or using electrochemical deposition. These techniques enable a conformal deposition of a semiconductor on top of $TiO_2$. A p-type semiconductor first fills up the pores of porous $TiO_2$ film and then tops the whole structure with a layer about 10 to 200 nm thick. Because of the rough $TiO_2$ surface and a conformal deposition of a p-type semiconductor, the interface area between a p-type semiconductor and an oxide layer increases more than 10 times in comparison to that for a flat $TiO_2$ film covered by a p-type semiconductor layer.

To decrease the relaxation rate of charge carriers, an absorber semiconductor can be inserted between $TiO_2$ (n-type semiconductor) and the solid hole conductor material. In this structure, the n-type semiconductor (oxide, example: $TiO_2$) has a porous structure and the absorber semiconductor is adsorbed at the surface of n-type semiconductor forming individual quantum dots. The average size of the absorber semiconductor quantum dots is below 10 nm to utilize the confinement effect and reduce the relaxation rate of hot carriers increasing efficiency of these solar cells. In the existing fabrication processes of solid state sensitized solar cells porous or rough $TiO_2$ layer is filled (using-electrochemical deposition techniques) with absorber semiconductor grains and covered with p-type semiconductor (using atomic layer deposition or electrochemical deposition techniques) or a different hole conducting inorganic material (using for example spin coating of a solution of hole conductor and chlorobenzene (See J. Kruger, U. Bach, R. Plass, M. Piccerelli, L. Cevey, M. Graetzel, Mat. Res. Soc. Symp. Proc., 708, BB9.1.1 (2002)).

The hole conductor may be an organic transport material. This organic charge transport material may be a polymer, like poly-tiophen or poly-arylamin. The hole conductor may be an organic hole conductor such as spiro- and hetero spiro compounds of the general formula (1)

(1)

where φ is one of C, Si, Ge or Sn, and K1 and K2 are, independently one of the other conjugated systems. One example organic hole conductor is spiro-OMeTAD (2,2',7,7'-tretakis(N,N-di-p-methoxyphenyl-amine)-9-9'-spirobifluorene). The conductivity of pure spiro-OMeTAD is low. Therefore the material cannot be used, without some modification, in solar cells. Rather, partial oxidation of spiro-OMeTAD by $N(PhBr)_3SbCl_6$ can be used to control the dopant level and to increase the conductivity of the hole conducting layer. A second additive $Li[CF_3SO_2]_2N$ can also be added, since Li+ ions have been shown to increase the current output and overall efficiency of the device. The hole conductor matrix can be applied by spin-coating of a solution of the hole conductor in chlorobenzene. MEH-PPV [poly[2-methoxy-[5-(2'-ethyl)hexyl]oxy-p-phenylenevinylene]] and PEDOT:PSS [poly(3,4-ethylenedioxythiophene) poly(styrenesulfonate)] can also be used as hole conductor materials. To increase its conductivity PEDOT:PSS can be mixed with glycerin, N-methylpyrrolidone, and isopropanol.

SUMMARY

The present invention provides methods, apparatuses and systems directed to novel photovoltaic structures for the conversion of solar irradiance into electrical free energy. In particular implementations, the novel photovoltaic structures can be fabricated using low cost and scalable processes, such as magnetron sputtering. In a particular implementation, a photovoltaic cell includes a photoactive conversion layer comprising one or more granular semiconductor and oxide layers with nanometer-size semiconductor grains surrounded by a matrix of oxide. The semiconductor and oxide layer can be a disposed between electrode layers. In a particular implementation, a photovoltaic cell includes a granular semiconductor and oxide layer with nanometer-size absorber semiconductor grains surrounded by a matrix of oxide. The semiconductor of the semiconductor and oxide layer may be an intrinsic, n-type or p-type semiconductor. The semiconductor and oxide layer may be disposed between electron and hole conducting layers, which may be continuous material layers and/or semiconductor and oxide layers as well. In some implementations, multiple semiconductor and oxide layers can be deposited using magnetron sputtering.

These so-called semiconductor and oxide layers, in some implementations, absorb sun light and convert solar irradiance into electrical free energy. Upon illumination with solar irradiance, the nanometer size semiconductor grains inject electrons into the conducting band of oxide, creating charge separation and producing photovoltaic effect. Following charge separation, electrodes extract electrons and holes to produce current. The charge carriers created as a result of photon absorption in the nanometer-size semiconductor grains can be also separated by an electric field formed by the presence of p- and n-type semiconductor layers adjacent to the absorber semiconductor and oxide layer.

The properties of the semiconductor grains can be controlled, and in some instances varied, to achieve a variety of effects and advantages. For example, the size of the semiconductor grains can be configured to facilitate extraction of charge carriers before they can relax to the band edge, increasing the efficiency of the photon conversion in nanometer sized semiconductor absorbers. In addition, the size and/or composition of the semiconductor grains in multiple semiconductor and oxide layers can be varied to match the band gap energies of the semiconductor grains to the solar energy spectrum. This can further reduce the energy loss due to the relaxation of carriers to their respective band edges. The composition of the semiconductor grains can also be varied. For example, one or more of the semiconductor and oxide layers may contain gold (Au).

DESCRIPTION OF THE DRAWINGS

FIGS. 1e, 1f and 1g illustrate the microstructure configuration of a semiconductor and oxide layer according to an implementation of the invention.

FIG. 1i is a diagram illustrating how semiconductor grain diameter may be determined according to one possible implementation of the invention.

FIGS. 2a to 5b provide example composite photoactive layers that may be used in photovoltaic cells of the present invention.

FIG. 6 illustrates a photovoltaic cell configuration according to one possible implementation of the invention.

FIGS. 7a to 7c provide example composite layer configurations, including seed layers and interlayers, that may be used in photovoltaic cells of the present invention

FIGS. 10a to 11e illustrate example composite photoactive layers that may be used in photovoltaic cells of the present invention.

DESCRIPTION OF PREFERRED EMBODIMENT(S)

A. Overview

Figure 1A:
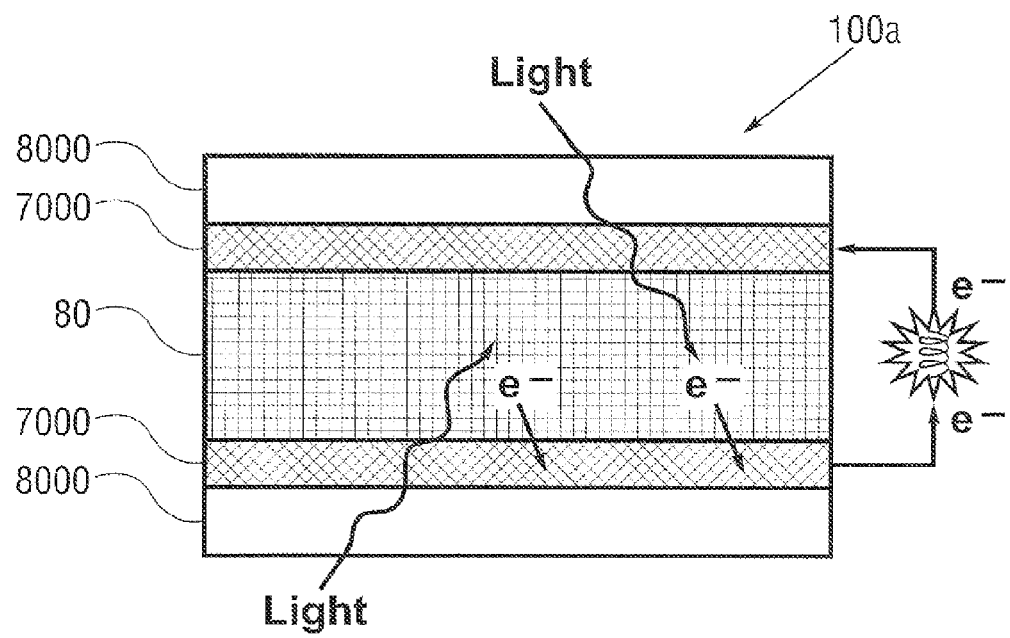
FIGS. 1a to 1d illustrate example photovoltaic cell structures according to various implementations of the invention.

FIGS. 1a to 1d illustrate example structures and configurations of solar cells according to several possible implementations of the invention. As FIG. 1a illustrates, a solar cell 100a may comprise, in overlying sequence a transparent layer 8000, a transparent conductive layer 7000, a photoactive conversion layer 80, a second transparent conductive layer 7000 and a second transparent material layer 8000. In a particular implementation, the transparent conductive layer 7000 may be indium oxide doped with tin oxide. In some implementations, the transparent layer 8000 may be glass, plastic or other suitable protective material.

Figure 1B:
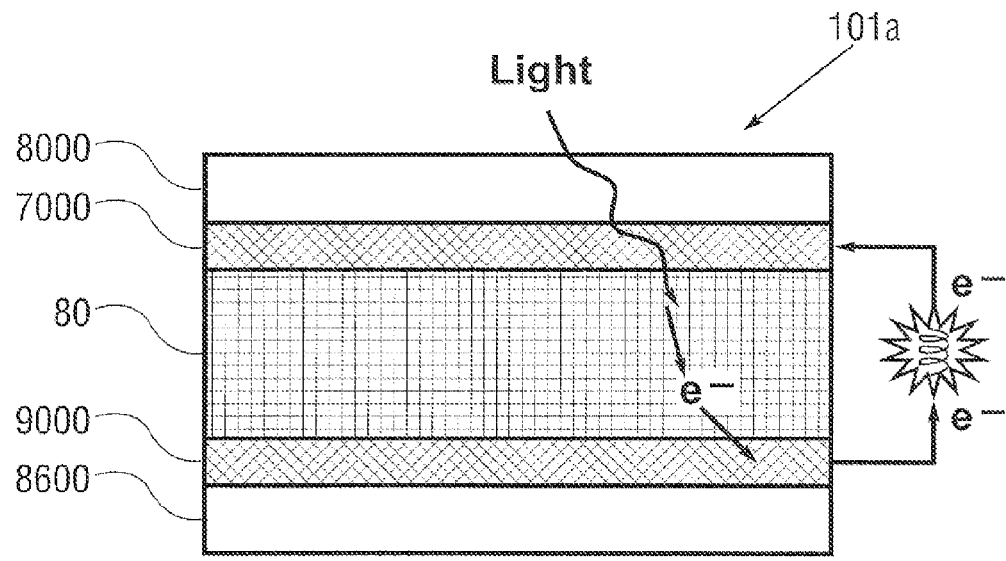
Figure 1C:
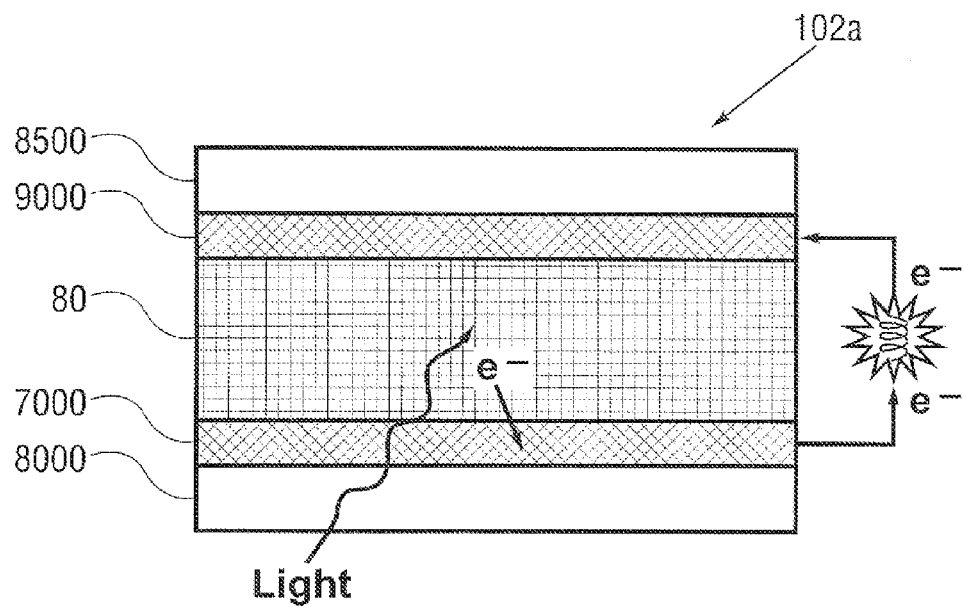
Figure 1D:
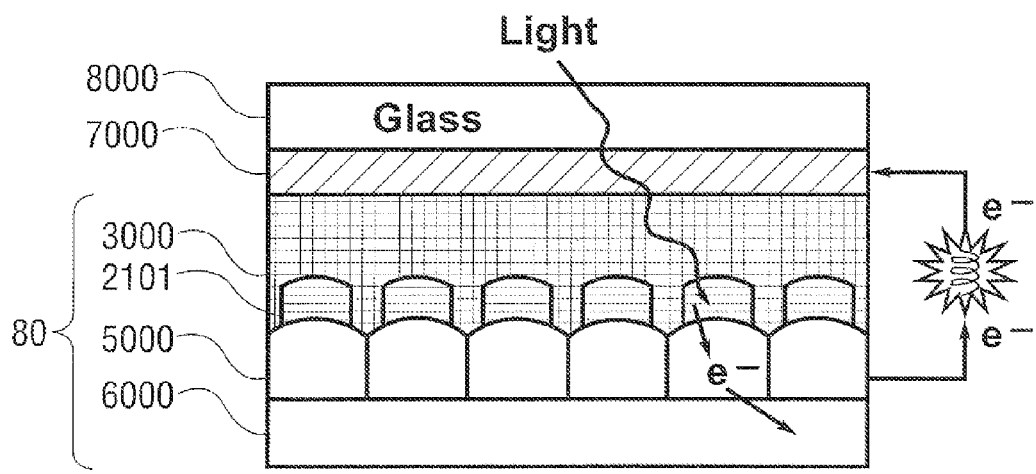

In other implementations, solar cell 101a, as FIG. 1b shows, may comprise (in overlying sequence) non-transparent substrate 8600, contact layer 9000, photoactive conversion layer 80, transparent conductive layer 7000, and transparent material layer 8000. FIG. 1c shows solar cell 102a comprising (in overlying sequence) transparent substrate 8000, transparent conductive layer 7000, photoactive conversion layer 80, contact layer 9000, and non-transparent protective layer 8500. Contact layer 9000 may comprise a metal, an oxide, or any other conductive material. As FIG. 1d illustrates, photoactive conversion layer 80 may include a plurality of sub-layers including one or more of a seed layer 6000, one or more interlayers 5000 (in this implementation, the seed layer 6000 and interlayers 5000 may replace the contact layer 9000), one or more n-type semiconductor and oxide layers 2101, and a hole conducting material layer 3000. As the following description demonstrates, the structure and configuration of the conversion layer 80 may vary considerably.

Transparent layer 8000 can be a glass substrate or deposited layer made of a variety of materials, such as silicon dioxide. Alternatively, a transparent polymer can be used. Still further, one or more of the transparent conducting layers 7000 can be replaced by metal contacts arranged in a grid (e.g., fingers and busbars) on one side (or both sides) and a full area metal contact on the other side. Additional layers, such as anti-reflection coatings can also be added. The layer stack can be deposited on glass, polymer or metal substrates. If the layer stack is deposited on top of a non-transparent substrate, the top contact is transparent to allow light penetration into the photoactive conversion layer. Transparent substrate layer 8000 can be replaced by other suitable protective layers or coatings, or be added during construction of a solar module or panel. Still further, the layers described herein may be deposited on a flat substrate (such as a glass substrate intended for window installations), or directly on one or more surfaces of a non-imaging solar concentrator, such as a trough-like or Winston optical concentrator.

Photoactive conversion layer 80 may include multiple sub-layers having various conductive properties and other characteristics, which, in combination, can be configured to produce a photovoltaic effect in response to solar energy. The material composition, layer configuration and layer arrangement of the photovoltaic cells can be configured to achieve a variety of objectives. For example, the materials used in these layers may be configured to create p-n heterojunctions. An n-type semiconductor and oxide layer, an i-type semiconductor and oxide layer, and/or a p-type semiconductor and oxide layer, in some implementations, can be sensitizing or absorber layers. With reference to FIG. 1d (for example), upon photo excitation, built-up potential from p-n junction direct electrons toward the n-type semiconductor and oxide layer 2101 and holes toward an electron conducting material, creating a charge separation and producing photovoltaic effect. Upon photo excitation, electrons are also efficiently injected from the conducting band of the semiconductor grains of n-type semiconductor and oxide layer 2101 into the conducting band of oxide material, further contributing to a charge separation and photovoltaic effect. Regeneration of the absorber semiconductor grains can occur by capture of electrons from the hole conducting material layer 3000.

One or more intrinsic semiconductor layers can be disposed between these p-type and n-type semiconductor layers, as well. The material composition, layer configuration and layer arrangement of the photovoltaic cells can be configured to achieve a variety of objectives. For example, depending on material choice, the nanometer-diameter grains of the intrinsic semiconductor and oxide layer can operate as absorbers in a p-n heterojunction between an oxide material (such as TiO2) and a hole conducting material (such as OMeTAD). To achieve efficient electron injection into the electron conducting layer, the bottom edge of the conductive band of the absorber, $E_C$(absorber), should be higher than the bottom edge of the conductive band of the electron conducting layer or oxide material, $E_C$ (electron conducting layer or oxide material). On the other hand, the top edge of the valence band of the absorber, $E_V$(absorber), should be lower than the top edge of the valence band of the hole conducting layer, $E_V$, or the Fermi level of organic hole conductor material, to promote efficient regeneration of the absorber semiconductor grains. In other implementations, the layers of the cell structure can be configured to create p-n junctions with an electric field across the depletion region between a p-type semiconductor layer and an n-type semiconductor layer. One or more intrinsic semiconductor layers can be disposed between these p-type and n-type semiconductor layers, as well. As discussed herein, multiple semiconductor and oxide layers may be deposited. Furthermore, the semiconductor material in semiconductor and oxide layers may be an intrinsic semiconductor material, a p-type semiconductor material, or an n-type semiconductor material. Various implementations discussed below utilize one or more of these semiconductor and oxide layers in varying configurations, combinations and arrangements to yield high efficiency solar cells.

Structurally, and with reference to FIGS. 1e to 1g, semiconductor and oxide layers 21xy are granular layers comprising a plurality of nanometer-diameter semiconductor grains 98 contained in, or surrounded by, a matrix of oxide material 99. In other words, the oxide material is dispersed at grain boundaries 97 of the semiconductor. For purposes of this disclosure, reference numbers for the semiconductor and oxide layers follow a convention of 21xy, where "x" denotes a sub-layer number and y denotes the type of semiconductor (y=1 corresponds to n-type, y=2 corresponds to p-type and y=0 corresponds to i-type or intrinsic semiconductor). Still further, a lower case variable (such as "x", "t", "s", "m") refers to a particular layer when used in the form such as "semiconductor and oxide layer 21x1, while the capital form of a given variable refers to the maximum value of that variable. For purposes of description, this disclosure refers to an intrinsic semiconductor and oxide layers using a reference number convention of 21x0, where x equals a layer number from 1 to X (where X equals the number of layers). Similarly, this disclosure refers to n-type semiconductor and oxide layers using a reference number convention of 21x1, where x equals a layer number from 1 to X. Lastly, this disclosure refers to p-type semiconductor and oxide layers using a reference number convention of 21x2, where x equals a layer number from 1 to X.

Formation of the semiconductor and oxide layers 21xy is discussed below. In the semiconductor and oxide layer(s), upon photoexcitation of semiconductor grains 98, electrons are injected into the surrounding oxide matrix 99 or generated charge carriers (electrons and holes) are separated by an electric field created by p-type and n-type semiconductor materials in the adjacent layers. In the photovoltaic cells illustrated in FIGS. 2a and 2b, for example, one of the semiconductor and oxide layers 21xy may comprise intrinsic semiconductor grains that operate as absorbers. In other words, light excites electrons in the absorber semiconductor grains 98, which are injected into the conduction band of the oxide matrix 99 or into the conduction band of an electron conductor. The absorber semiconductor grains 98 are regenerated by capture of electrons from the valence band of a hole conducting material layer (such as a p-type semiconductor).

A.1. Semiconductor and Oxide Layer

Structurally, semiconductor and oxide layer 21xy is a granular layer comprising a plurality of nanometer-sized cylinder-like semiconductor grains 98 contained in, or surrounded by, a matrix of oxide material 99. In other words, the oxide material is dispersed at grain boundaries 97 of the semiconductor. Formation of the semiconductor and oxide layer 21$xy$ is discussed below. In the semiconductor and oxide layer(s), upon photoexcitation of semiconductor grains 98, electrons are injected into the surrounding oxide matrix 99 or generated charge carriers (electrons and holes) are separated by an electric field created by p-type and n-type semiconductor materials in the adjacent layers.

FIGS. 1$e$ to 1$g$ illustrate an example microstructure of the semiconductor and oxide layer 21$xy$ according to one possible implementation of the invention. One skilled in the art will recognize that these Figures are idealized representations of the microstructure of the semiconductor grains 98 and that the boundaries between the semiconductor grains and the oxide matrix may, and often will, not be defined by perfect cylinders. For example, in the semiconductor and oxide layers, the semiconductor grains will generally not have a perfect cylindrical shape. In addition, in some instances, neighboring semiconductor grains may be in direct contact as opposed to being completely separated by oxide material. The size of cylinder-like semiconductor grains in the semiconductor and oxide layer is defined by the diameter and the height of these grains. The diameters of the semiconductor grains at a given layer may vary from a minimum to a maximum grain diameter. The average semiconductor grain diameter can be defined as the mean or average value of all semiconductor grain diameters in the semiconductor and oxide layer 21$xy$. FIG. 1$i$ shows an example of a semiconductor grain 98 surrounded by an oxide material. Since grains generally do not have a perfect cylindrical shape, the diameter of the grain can be defined as $2*(S/\pi)^{0.5}$ where S is the area of the top surface of the grain, i.e., S is the surface area that the semiconductor grain shares with the layer deposited on top of the semiconductor and oxide layer 21$xy$. The average diameter of the semiconductor grains in the semiconductor and oxide layer can vary considerably up to about 100 nm. However, a preferred average diameter of the semiconductor grains in the semiconductor and oxide layer can be up to 5, 10, 15, 20 or 40 nm. Some semiconductor and oxide layers may have smaller average diameters as well. The height of the semiconductor grain is substantially equal to the thickness of the semiconductor and oxide layer 2100. The thickness of the layers can vary considerably up to about 4000 nm. However, a preferred thickness of the semiconductor and oxide layer can be up to 400 nm. In some implementations, multiple semiconductor and oxide sub-layers (each with varying the average semiconductor grain diameters ranging from 3 to 12 nm and thicknesses ranging from 3 to 25 nm) can be deposited. In one example configuration, five semiconductor and oxide sub-layers with the average semiconductor grain diameter, in descending order, of 12/10/7/5/3 nanometers and thicknesses, in descending order, of 25/10/7/5/3 nanometers can be deposited. In other implementations, however, the thickness of a given layer can vary independently of grain size. For example, variation of the thickness of the semiconductor and oxide layers need not follow the grain size. For example, the thickness of the semiconductor and oxide layers may remain constant, while the average grain size varies across the layers. As long as one dimension is reduced the effects due to varying grain size can be achieved. Normally, changing the average semiconductor grain diameter should have a larger effect than changing the thickness of the semiconductor and oxide sub-layers thickness, because the change in diameter affect changes in two dimensions. If both the average semiconductor grain diameter and the thickness of the semiconductor and oxide sub-layers is reduced, the size effect is maximized because the reduction is present in all three directions. Still further, the oxide content of the semiconductor and oxide layers can range from 1 to 99 percent of a given layer by volume. However, a preferred oxide content of the semiconductor and oxide layers can range from 5 to 75 percent of a given layer by volume.

As discussed, multiple semiconductor and oxide layers may be deposited. Furthermore, the semiconductor material in semiconductor and oxide layers may be an intrinsic semiconductor material, a p-type semiconductor material, or an n-type semiconductor material. Various implementations discussed below utilize one or more of these semiconductor and oxide layers in varying configurations, combinations and arrangements to yield high efficiency solar cells.

In photovoltaic cells including one or more intrinsic semiconductor and oxide layers 21$x$0, for example, intrinsic semiconductor grains operate as absorbers. In other words, light excites electrons in the absorber semiconductor grains 98, which are injected into the conduction band of the oxide matrix 99 or into the conduction band of an electron conductor. The absorber semiconductor grains 98 are regenerated by capture of electrons from the valence band of a hole conducting material layer 3000 (such as a p-type semiconductor). For intrinsic semiconductor and oxide layer 21$x$0, the semiconductor material may be an intrinsic semiconductor comprising one or more of silicon (Si), germanium (Ge), tin (Sn), beta iron silicide ($\beta$-FeSi$_2$), indium antimony (InSb), indium arsenic (InAs), indium phosphate (InP), gallium phosphate (GaP), aluminum phosphate (AlP), gallium arsenic (GaAs), gallium antimony (GaSb), aluminum antimony (AlSb), silicon carbide (SiC), tellurium (Te), zinc antimony (ZnSb), mercury telluride (HgTe), led sulfide (PbS), led selenide (PbSe), led telluride (PbTe), cadmium sulfide (CdS), cadmium selenium (CdSe), cadmium tellurium (CdTe), zinc sulfide (ZnS), zinc selenide (ZnSe), zinc telluride (ZnTe), tin telluride (SnTe), copper sulfide (Cu$_{1-x}$S (x varies from 1 to 2)), copper selenide (Cu$_{1-x}$Se (x varies from 1 to 2)), copper indium disulfide (CuInS$_2$), copper gallium disulfide (CuGaS$_2$), copper indium gallium disulfide, (Cu(In$_{1-x}$Ga$_x$)S$_2$ (x varies from 0 to 1)), copper indium diselenide (CuInSe$_2$), copper gallium diselenide (CuGaSe$_2$), copper indium gallium diselenide (Cu(In$_{1-x}$Ga$_x$)Se$_2$ (x varies from 0 to 1)), copper silver indium gallium disulfide (Cu$_{1-x}$Ag$_x$)(In$_{1-y}$Ga$_y$)S$_2$ (x varies from 0 to 1, y varies from 0 to 1)), copper silver indium gallium diselenide (Cu$_{1-x}$Ag$_x$)(In$_{1-y}$Ga$_y$)Se$_2$ (x varies from 0 to 1, y varies from 0 to 1)), (Cu$_{1-x}$Au$_x$)InS$_2$ (x varies from 0 to 1), (Cu$_{1-x}$Au$_x$)CuGaS$_2$ (x varies from 0 to 1), (Cu$_{1-x}$Au$_x$)(In$_{1-y}$Ga$_y$)S$_2$ (x varies from 0 to 1, y varies from 0 to 1), (Cu$_{1-x}$Au$_x$)InSe$_2$ (x varies from 0 to 1), (Cu$_{1-x}$Au$_x$)GaSe$_2$ (x varies from 0 to 1), (Cu$_{1-x}$Au$_x$)(In$_{1-y}$Ga$_y$)Se$_2$ (x varies from 0 to 1), (Ag$_{1-x}$Au$_x$)(In$_{1-y}$Ga$_y$)Se$_2$ (x varies from 0 to 1), (Cu$_{1-x-y}$Ag$_x$Au$_y$)(In$_{1-z}$Ga$_z$)Se$_2$ (x varies from 0 to 1, y varies from 0 to 1, z varies from 0 to 1), (Cu$_{1-x}$Au$_x$)$_2$S (x varies from 0 to 1), (Ag$_{1-x}$Au$_x$)$_2$S (x varies from 0 to 1), (Cu$_{1-x-y}$Ag$_x$Au$_y$)$_2$S (x varies from 0 to 1, y varies from 0 to 1), indium sulfide (In$_2$S$_3$), indium selenide (In$_2$Se$_3$), aluminum nitride (AlN), indium nitride (InN), gallium nitride (GaN), bismuth sulfide (Bi$_2$S$_3$), antimony sulfide (Sb$_2$S$_3$), silver sulfide (Ag$_2$S), tungsten sulfide (WS$_2$), tungsten selenide (WSe$_2$), molybdenum sulfide (MoS$_2$), molybdenum selenide (MoSe$_2$), tin sulfide (SnS$_x$ (x varies from 1 to 2)), tin selenide (SnSe$_x$ (x varies from 1 to 2)), and copper tin sulfide (Cu$_4$SnS$_4$).

The oxide material, for intrinsic semiconductor and oxide layers, may include one or more of magnesium (Mg) oxide, aluminum (Al) oxide, silicon (Si) oxide, titanium (Ti) oxide, vanadium (V) oxide, chromium (Cr) oxide, manganese (Mn)

oxide, iron (Fe) oxide, cobalt (Co) oxide, nickel (Ni) oxide, copper (Cu) oxide, zinc (Zn) oxide, gallium (Ga) oxide, germanium (Ge) oxide, selenium (Se) oxide, yttrium (Y) oxide, zirconium (Zr) oxide, niobium (Nb) oxide, molybdenum (Mo) oxide, indium (In) oxide, tin (Sn) oxide, antimony (Sb) oxide, tellurium (Tl) oxide, hafnium (Hf) oxide, tantalum (Ta) oxide, tungsten (W) oxide, mercury (Hg) oxide, lead (Pb) oxide, and bismuth (Bi) oxide.

For n-type semiconductor and oxide layers $21x1$, for example, the semiconductor material may be an n-type semiconductor comprising one or more of silicon (Si), germanium (Ge), tin (Sn), beta iron silicide (β-FeSi$_2$), indium antimony (InSb), indium arsenic (InAs), indium phosphate (InP), gallium phosphate (GaP), aluminum phosphate (AlP), gallium arsenic (GaAs), gallium antimony (GaSb), aluminum antimony (AlSb), silicon carbide (SiC), tellurium (Te), zinc antimony (ZnSb), mercury telluride (HgTe), led sulfide (PbS), led selenide (PbSe), led telluride (PbTe), cadmium sulfide (CdS), cadmium selenium (CdSe), cadmium tellurium (CdTe), zinc sulfide (ZnS), zinc selenide (ZnSe), zinc telluride (ZnTe), tin telluride (SnTe), copper sulfide (Cu$_{1-x}$S (x varies from 1 to 2)), copper selenide (Cu$_{1-x}$Se (x varies from 1 to 2)), copper indium disulfide (CuInS$_2$), copper gallium disulfide (CuGaS$_2$), copper indium gallium disulfide, (Cu(In$_{1-x}$Ga$_x$)S$_2$ (x varies from 0 to 1)), copper indium diselenide (CuInSe$_2$), copper gallium diselenide (CuGaSe$_2$), copper indium gallium diselenide (Cu(In$_{1-x}$Ga$_x$)Se$_2$ (x varies from 0 to 1)), copper silver indium gallium disulfide-(Cu$_{1-x}$Ag$_x$)(In$_{1-y}$Ga$_y$)S$_2$ (x varies from 0 to 1, y varies from 0 to 1)), copper silver indium gallium diselenide (Cu$_{1-x}$Ag$_x$)(In$_{1-y}$Ga$_y$)Se$_2$ (x varies from 0 to 1, y varies from 0 to 1)), (Cu$_{1-x}$Au$_x$)InS$_2$ (x varies from 0 to 1), (Cu$_{1-x}$Au$_x$)CuGaS$_2$ (x varies from 0 to 1), (Cu$_{1-x}$Au$_x$)(In$_{1-y}$Ga$_y$)S$_2$ (x varies from 0 to 1, y varies from 0 to 1), (Cu$_{1-x}$Au$_x$)InSe$_2$ (x varies from 0 to 1), (Cu$_{1-x}$Au$_x$)GaSe$_2$ (x varies from 0 to 1), (Cu$_{1-x}$Au$_x$)(In$_{1-x}$Ga$_x$)Se$_2$ (x varies from 0 to 1), (Ag$_{1-x}$Au$_x$)(In$_{1-x}$Ga$_x$)Se$_2$ (x varies from 0 to 1), (Cu$_{1-x-y}$Ag$_x$Au$_y$)(In$_{1-z}$Ga$_z$)Se$_2$ (x varies from 0 to 1, y varies from 0 to 1, z varies from 0 to 1), (Cu$_{1-x}$Au$_x$)$_2$S (x varies from 0 to 1), (Ag$_{1-x}$Au$_x$)$_2$S (x varies from 0 to 1), (Cu$_{1-x-y}$Ag$_x$Au$_y$)$_2$S (x varies from 0 to 1, y varies from 0 to 1), indium sulfide (In$_2$S$_3$), indium selenide (In$_2$Se$_3$), aluminum nitride (AlN), indium nitride (InN), gallium nitride (GaN), bismuth sulfide (Bi$_2$S$_3$), antimony sulfide (Sb$_2$S$_3$), silver sulfide (Ag$_2$S), tungsten sulfide (WS$_2$), tungsten selenide (WSe$_2$), molybdenum sulfide (MoS$_2$), molybdenum selenide (MoSe$_2$), tin sulfide (SnS$_x$ (x varies from 1 to 2)), tin selenide (SnSe$_x$ (x varies from 1 to 2)), copper tin sulfide (Cu$_4$SnS$_4$). Such semiconductors may be doped by adding an impurity of valence-five elements such as nitrogen (N), phosphorus (P), arsenic (As), or antimony (Sb)), in order to increase the number of free (in this case negative (electron)) charge carriers.

The oxide material, for n-type semiconductor and oxide layers, may include one or more of magnesium (Mg) oxide, aluminum (Al) oxide, silicon (Si) oxide, titanium (Ti) oxide, vanadium (V) oxide, chromium (Cr) oxide, manganese (Mn) oxide, iron (Fe) oxide, cobalt (Co) oxide, nickel (Ni) oxide, copper (Cu) oxide, zinc (Zn) oxide, gallium (Ga) oxide, germanium (Ge) oxide, selenium (Se) oxide, yttrium (Y) oxide, zirconium (Zr) oxide, niobium (Nb) oxide, molybdenum (Mo) oxide, indium (In) oxide, tin (Sn) oxide, antimony (Sb) oxide, tellurium (Tl) oxide, hafnium (Hf) oxide, tantalum (Ta) oxide, tungsten (W) oxide, mercury (Hg) oxide, lead (Pb) oxide, and bismuth (Bi) oxide.

For p-type semiconductor and oxide layers $21x2$, the semiconductor material may be an p-type semiconductor comprising one or more of silicon (Si), germanium (Ge), tin (Sn), beta iron silicide (β-FeSi$_2$), indium antimony (InSb), indium arsenic (InAs), indium phosphate (InP), gallium phosphate (GaP), aluminum phosphate (AlP), gallium arsenic (GaAs), gallium antimony (GaSb), aluminum antimony (AlSb), silicon carbide (SiC), tellurium (Te), zinc antimony (ZnSb), mercury telluride (HgTe), led sulfide (PbS), led selenide (PbSe), led telluride (PbTe), cadmium sulfide (CdS), cadmium selenium (CdSe), cadmium tellurium (CdTe), zinc sulfide (ZnS), zinc selenide (ZnSe), zinc telluride (ZnTe), tin telluride (SnTe), copper sulfide (Cu$_{1-x}$S (x varies from 1 to 2)), copper selenide (Cu$_{1-x}$Se (x varies from 1 to 2)), copper indium disulfide (CuInS$_2$), copper gallium disulfide (CuGaS$_2$), copper indium gallium disulfide, (Cu(In$_{1-x}$Ga$_x$)S$_2$ (x varies from 0 to 1)), copper indium diselenide (CuInSe$_2$), copper gallium diselenide (CuGaSe$_2$), copper indium gallium diselenide (Cu(In$_{1-x}$Ga$_x$)Se$_2$ (x varies from 0 to 1)), copper silver indium gallium disulfide (Cu$_{1-x}$Ag$_x$)(In$_{1-y}$Ga$_y$)S$_2$ (x varies from 0 to 1, y varies from 0 to 1)), copper silver indium gallium diselenide (Cu$_{1-x}$Ag$_x$)(In$_{1-y}$Ga$_y$)Se$_2$ (x varies from 0 to 1, y varies from 0 to 1)), (Cu$_{1-x}$Au$_x$)InS$_2$ (x varies from 0 to 1), (Cu$_{1-x}$Au$_x$)CuGaS$_2$ (x varies from 0 to 1), (Cu$_{1-x}$Au$_x$)(In$_{1-y}$Ga$_y$)S$_2$ (x varies from 0 to 1, y varies from 0 to 1), (Cu$_{1-x}$Au$_x$)InSe$_2$ (x varies from 0 to 1), (Cu$_{1-x}$Au$_x$)GaSe$_2$ (x varies from 0 to 1), (Cu$_{1-x}$Au$_x$)(In$_{1-x}$Ga$_x$)Se$_2$ (x varies from 0 to 1), (Ag$_{1-x}$Au$_x$)(In$_{1-x}$Ga$_x$)Se$_2$ (x varies from 0 to 1), (Cu$_{1-x-y}$Ag$_x$Au$_y$)(In$_{1-z}$Ga$_z$)Se$_2$ (x varies from 0 to 1, y varies from 0 to 1, z varies from 0 to 1), (Cu$_{1-x}$Au$_x$)$_2$S (x varies from 0 to 1), (Ag$_{1-x}$Au$_x$)$_2$S (x varies from 0 to 1), (Cu$_{1-x-y}$Ag$_x$Au$_y$)$_2$S (x varies from 0 to 1, y varies from 0 to 1), indium sulfide (In$_2$S$_3$), indium selenide (In$_2$Se$_3$), aluminum nitride (AlN), indium nitride (InN), gallium nitride (GaN), bismuth sulfide (Bi$_2$S$_3$), antimony sulfide (Sb$_2$S$_3$), silver sulfide (Ag$_2$S), tungsten sulfide (WS$_2$), tungsten selenide (WSe$_2$), molybdenum sulfide (MoS$_2$), molybdenum selenide (MoSe$_2$), tin sulfide (SnS$_x$ (x varies from 1 to 2)), tin selenide (SnSe$_x$ (x varies from 1 to 2)), copper tin sulfide (Cu$_4$SnS$_4$). Such semiconductors may be doped by adding an impurity of valence-three elements such as boron (B), gallium (Ga), indium (In), or aluminum (Al), in order to increase the number of free (in this case positive (hole)) charge carriers.

The oxide material, for p-type semiconductor and oxide layers, may include one or more of magnesium (Mg) oxide, aluminum (Al) oxide, silicon (Si) oxide, titanium (Ti) oxide, vanadium (V) oxide, chromium (Cr) oxide, manganese (Mn) oxide, iron (Fe) oxide, cobalt (Co) oxide, nickel (Ni) oxide, copper (Cu) oxide, zinc (Zn) oxide, gallium (Ga) oxide, germanium (Ge) oxide, selenium (Se) oxide, yttrium (Y) oxide, zirconium (Zr) oxide, niobium (Nb) oxide, molybdenum (Mo) oxide, indium (In) oxide, tin (Sn) oxide, antimony (Sb) oxide, tellurium (Tl) oxide, hafnium (Hf) oxide, tantalum (Ta) oxide, tungsten (W) oxide, mercury (Hg) oxide, lead (Pb) oxide, and bismuth (Bi) oxide.

In some implementations, the conversion layer 80 may include one or more metal and oxide layers 22g0, 22h0, 22i0, 22j0 and 22k0. Metal and oxide layers 22g0, 22h0, 22i0, 22j0 and 22k0 include a metal and an oxide. In a particular implementation, the metal may be at least one metal material selected from group consisting of Al, Ti, V, Cr, Mn, Fe, Co, Ni, Cu, Zr, Nb, Mo, Ru, Rh, Pd, Pt, Ag, Hf, Ta, W, Re, Ir, Au. The oxide material may be at least one oxide material selected from group consisting of: magnesium (Mg) oxide, aluminum (Al) oxide, silicon (Si) oxide, titanium (Ti) oxide, vanadium (V) oxide, chromium (Cr) oxide, manganese (Mn) oxide, iron (Fe) oxide, cobalt (Co) oxide, nickel (Ni) oxide, copper (Cu) oxide, zinc (Zn) oxide, gallium (Ga) oxide, germanium (Ge) oxide, selenium (Se) oxide, yttrium (Y) oxide, zirconium (Zr) oxide, niobium (Nb) oxide, molybdenum (Mo) oxide, indium (In) oxide, tin (Sn) oxide, antimony (Sb) oxide, tellurium (Tl)

oxide, hafnium (Hf) oxide, tantalum (Ta) oxide, tungsten (W) oxide, mercury (Hg) oxide, lead (Pb) oxide, and bismuth (Bi) oxide.

A.2. Electron Conducting Material Layer

Electron conducting material layer $10n0$ and $10z0$ may be an oxide material, an n-type semiconductor material, or an organic electron conducting material. Inorganic electron conducting materials, such as oxides and n-type semiconductors, may have a crystalline structure. The melting temperature of an inorganic electron conducting material (oxide or n-type semiconductor) and glass temperature of organic electron conducting material should be above 80 C.

Electron conducting material layer $10n0$ and $10z0$ may be an oxide material including one or more of titanium (Ti) oxide (such as $TiO_2$), aluminum (Al) oxide, cobalt (Co) oxide, silicon (Si) oxide, tin (Sn) oxide, zinc (Zn) oxide, molybdenum (Mo) oxide, tantalum (Ta) oxide, tungsten (W) oxide, indium (In) oxide, magnesium (Mg) oxide, bismuth (Bi) oxide, copper (Cu) oxide, vanadium (V) oxide, chromium (Cr) oxide. Electron conducting material layer $1000$ may be an n-type semiconductor material including one or more of silicon (Si), germanium (Ge), tin (Sn), beta iron silicide ($\beta$-$FeSi_2$), indium antimony (InSb), indium arsenic (InAs), indium phosphate (InP), gallium phosphate (GaP), aluminum phosphate (AlP), gallium gallium arsenic (GaAs), gallium antimony (GaSb), aluminum antimony (AlSb), silicon carbide (SiC), tellurium (Te), zinc antimony (ZnSb), mercury telluride (HgTe), led sulfide (PbS), led selenide (PbSe), led telluride (PbTe), cadmium sulfide (CdS), cadmium selenium (CdSe), cadmium tellurium (CdTe), zinc sulfide (ZnS), zinc selenide (ZnSe), zinc telluride (ZnTe), tin telluride (SnTe), copper sulfide ($Cu_{1-x}S$ (x varies from 1 to 2)), copper selenide ($Cu_{1-x}Se$ (x varies from 1 to 2)), copper indium disulfide ($CuInS_2$), copper gallium disulfide ($CuGaS_2$), copper indium gallium disulfide, ($Cu(In_{1-x}Ga_x)S_2$ (x varies from 0 to 1)), copper indium diselenide ($CuInSe_2$), copper gallium diselenide ($CuGaSe_2$), copper indium gallium diselenide ($Cu(In_{1-x}Ga_x)Se_2$ (x varies from 0 to 1)), copper silver indium gallium disulfide ($Cu_{1-x}Ag_x)(In_{1-y}Ga_y)S_2$ (x varies from 0 to 1, y varies from 0 to 1)), copper silver indium gallium diselenide ($Cu_{1-x}Ag_x)(In_{1-y}Ga_y)Se_2$ (x varies from 0 to 1, y varies from 0 to 1)), ($Cu_{1-x}Au_x)InS_2$ (x varies from 0 to 1), ($Cu_{1-x}Au_x)CuGaS_2$ (x varies from 0 to 1), ($Cu_{1-x}Au_x)(In_{1-y}Ga_y)S_2$ (x varies from 0 to 1, y varies from 0 to 1), ($Cu_{1-x}Au_x)InSe_2$ (x varies from 0 to 1), ($Cu_{1-x}Au_x)GaSe_2$ (x varies from 0 to 1), ($Cu_{1-x}Au_x)(In_{1-x}Ga_x)Se_2$ (x varies from 0 to 1), ($Ag_{1-x}Au_x)(In_{1-x}Ga_x)Se_2$ (x varies from 0 to 1), ($Cu_{1-x-y}Ag_xAu_y)(In_{1-z}Ga_z)Se_2$ (x varies from 0 to 1, y varies from 0 to 1, z varies from 0 to 1), ($Cu_{1-x}Au_x)_2S$ (x varies from 0 to 1), ($Ag_{1-x}Au_x)_2S$ (x varies from 0 to 1), ($Cu_{1-x-y}Ag_xAu_y)_2S$ (x varies from 0 to 1, y varies from 0 to 1), indium sulfide ($In_2S_3$), indium selenide ($In_2Se_3$), aluminum nitride (AlN), indium nitride (InN), gallium nitride (GaN), bismuth sulfide ($Bi_2S_3$), antimony sulfide ($Sb_2S_3$), silver sulfide ($Ag_2S$), tungsten sulfide ($WS_2$), tungsten selenide ($WSe_2$), molybdenum sulfide ($MoS_2$), molybdenum selenide ($MoSe_2$), tin sulfide ($SnS_x$ (x varies from 1 to 2)), tin selenide ($SnSe_x$ (x varies from 1 to 2)), copper tin sulfide ($Cu_4SnS_4$). Such semiconductors may be doped by adding an impurity of valence-five elements such as nitrogen (N), phosphorus (P), arsenic (As), or antimony (Sb)), in order to increase the number of free (in this case negative (electron)) charge carriers.

Alternatively, electron conducting material layer $10n0$ and $10z0$ may be an organic electron conducting material such as perylene benzimidazole (PBI), perylene bis(piridylethylimide) (PPyEI), perylene-bis(phenethylimide) (PPEI) and [6,6]-phenyl-$C_{71}$-butyric acid methyl ester (PCBM).

A.3. Hole Conducting Material Layer

Hole conducting material layer $30r0$ and $30v0$ may be a p-type semiconductor or other inorganic or organic hole conducting material. In a particular implementation, the melting temperature of an inorganic hole conducting material and the glass temperature of organic hole conducting material should be above 80 C.

In one implementation, hole conducting material layer $30r0$ and $30v0$ may comprise a semiconductor material that may be doped by adding an impurity of valence-three elements such as boron (B), gallium (Ga), indium (In) or aluminum (Al), in order to increase the number of free (in this case positive (hole)) charge carriers, including at least one of the following materials: silicon (Si), germanium (Ge), tin (Sn), beta iron silicide ($\beta$-$FeSi_2$), indium antimony (InSb), indium arsenic (InAs), indium phosphate (InP), gallium phosphate (GaP), aluminum phosphate (AlP), gallium arsenic (GaAs), gallium antimony (GaSb), aluminum antimony (AlSb), silicon carbide (SiC), tellurium (Te), zinc antimony (ZnSb), mercury telluride (HgTe), led sulfide (PbS), led selenide (PbSe), led telluride (PbTe), cadmium sulfide (CdS), cadmium selenium (CdSe), cadmium tellurium (CdTe), zinc sulfide (ZnS), zinc selenide (ZnSe), zinc telluride (ZnTe), tin telluride (SnTe), copper sulfide ($Cu_{1-x}S$ (x varies from 1 to 2)), copper selenide ($Cu_{1-x}Se$ (x varies from 1 to 2)), copper indium disulfide ($CuInS_2$), copper gallium disulfide ($CuGaS_2$), copper indium gallium disulfide, ($Cu(In_{1-x}Ga_x)S_2$ (x varies from 0 to 1)), copper indium diselenide ($CuInSe_2$), copper gallium diselenide ($CuGaSe_2$), copper indium gallium diselenide ($Cu(In_{1-x}Ga_x)Se_2$ (x varies from 0 to 1)), copper silver indium gallium disulfide ($Cu_{1-x}Ag_x)(In_{1-y}Ga_y)S_2$ (x varies from 0 to 1, y varies from 0 to 1)), copper silver indium gallium diselenide ($Cu_{1-x}Ag_x)(In_{1-y}Ga_y)Se_2$ (x varies from 0 to 1, y varies from 0 to 1)), ($Cu_{1-x}Au_x)InS_2$ (x varies from 0 to 1), ($Cu_{1-x}Au_x)CuGaS_2$ (x varies from 0 to 1), ($Cu_{1-x}Au_x)(In_{1-y}Ga_y)S_2$ (x varies from 0 to 1, y varies from 0 to 1), ($Cu_{1-x}Au_x)InSe_2$ (x varies from 0 to 1), ($Cu_{1-x}Au_x)GaSe_2$ (x varies from 0 to 1), ($Cu_{1-x}Au_x)(In_{1-x}Ga_x)Se_2$ (x varies from 0 to 1), ($Ag_{1-x}Au_x)(In_{1-x}Ga_x)Se_2$ (x varies from 0 to 1), ($Cu_{1-x-y}Ag_xAu_y)(In_{1-z}Ga_z)Se_2$ (x varies from 0 to 1, y varies from 0 to 1, z varies from 0 to 1), ($Cu_{1-x}Au_x)_2S$ (x varies from 0 to 1), ($Ag_{1-x}Au_x)_2S$ (x varies from 0 to 1), ($Cu_{1-x-y}Ag_xAu_y)_2S$ (x varies from 0 to 1, y varies from 0 to 1), indium sulfide ($In_2S_3$), indium selenide ($In_2Se_3$), aluminum nitride (AlN), indium nitride (InN), gallium nitride (GaN), bismuth sulfide ($Bi_2S_3$), antimony sulfide ($Sb_2S_3$), silver sulfide ($Ag_2S$), tungsten sulfide ($WS_2$), tungsten selenide ($WSe_2$), molybdenum sulfide ($MoS_2$), molybdenum selenide ($MoSe_2$), tin sulfide ($SnS_x$ (x varies from 1 to 2)), tin selenide ($SnSe_x$ (x varies from 1 to 2)), copper tin sulfide ($Cu_4SnS_4$). Such semiconductors may be doped by adding an impurity of valence-three elements such as boron (B) or aluminum (Al), in order to increase the number of free (in this case positive (hole)) charge carriers. Other suitable p-type semiconductor materials include copper thiocyanate (CuSCN), cuprous iodide (CuI), copper aluminum oxide ($CuAlO_2$) and organic hole-conductors, such as spiro-OMeTAD (2,2',7,7'-tretakis(N,N-di-p-methoxyphenyl-amine)-9-9'-spirofifluorene) (partial oxidation of spiro-OMeTAD by $N(PhBr)_3SbCl_6$ can be used to control the dopant level), MEH-PPV [poly[2-methoxy-[5-(2'-ethyl)hexyl]oxy-p-phenylenevinylene]] and PEDOT:PSS [poly(3,4-ethylenedioxythiophene) poly(styrenesulfonate)] (to increase its conductivity PEDOT:PSS can be mixed with glycerin, N-methylpyrrolidone, and isopropanol).

B. Fabrication of Photovoltaic Cell Layers

The semiconductor and oxide layers $21xy$ can be fabricated using a sputter deposition process (such as magnetron sputtering) in order to produce a layer structure that comprises semiconductor grains surrounded by an oxide matrix. The thickness of the semiconductor and oxide layer 21xy can range from 1 atomic monolayer to 4000 nm, while the average grain diameter can be up to 400 nm. In one embodiment, semiconductor and oxide layer thickness can be between about 1 to 400 nm, while average grain diameter can range from 2 to 40 nm. In a preferred embodiment, semiconductor and oxide layer thickness can be between about 3 to 25 nm, while average grain diameter can range from 3 to 12 nm. Sputtering conditions and other process settings result in dispersal of oxide at grain boundaries of the semiconductor, as well as control the size of semiconductor grains and the ratio between the volume fraction of semiconductor and oxide materials. In a particular implementation, a semiconductor and oxide layer including semiconductor grains isolated in a matrix of oxide can be prepared by sputtering a metal interlayer (such as an Ru interlayer) and then co-sputtering a semiconductor with an oxide material with low adatom mobility. The oxide material moves into the semiconductor grain boundaries and isolates the semiconductor grains. To reduce decomposition of oxide during the sputtering, an oxide material with large diatomic bond strength between metal and oxygen can be used.

As discussed above, the semiconductor grains 98 have a generally cylindrical or columnar shape where the dimension of the cylinder depends on the semiconductor grain diameter and the thickness of the semiconductor and oxide layer. The ratio between the volume fraction of oxide and semiconductor material can be controlled by varying the composition of sputtering target (source). Additionally, the diameter of absorber semiconductor grains can be controlled by sputtering an interlayer prior to sputtering the semiconductor and oxide layer. Semiconductor grains in the semiconductor and oxide layer grow on top of the interlayer grains while oxide is dispersed around the semiconductor grains. Thus, in most instances, the diameter of interlayer grains can control or strongly influence the diameter of semiconductor grains in the semiconductor and oxide layer deposited on the interlayer. Sometimes, if the interlayer grains are large (over 15 nm), it is also possible that two or more semiconductor grains grow on a single interlayer grain. The interface area between semiconductor grains 98 and oxide (both the oxide matrix and oxide in an adjacent layer) depends on the semiconductor grain diameter and the thickness of the semiconductor and oxide layer. However, the interface area can be over 100 times larger than that for a flat junction between an oxide layer and a semiconductor layer or films. As illustrated above, the semiconductor and oxide layer can be located between an oxide material (or other n-type semiconductor) and a p-type semiconductor (or other hole conducting material) that can also be sputtered with magnetron sputtering. This layer structure is used in solar cells where the semiconductor grains absorb the solar radiation. This process also allows fabrication of multilayer structures with semiconductor grains surrounded with oxide materials, where an oxide material preferentially grows on top of an oxide material and a semiconductor material preferentially grows on top of a semiconductor material. In multilayer structures the composition of oxide and semiconductor in each layer can be varied separately to increase the efficiency of photon conversion.

Figure 8:
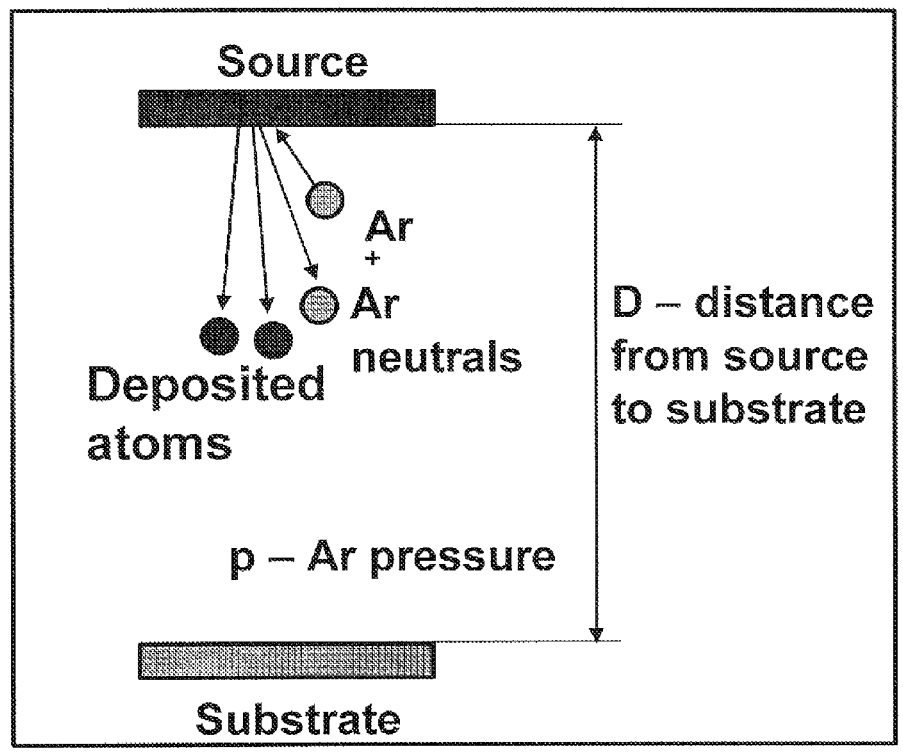
FIG. 8 is a schematic diagram illustrating an example sputter deposition process.

In an example sputtering process, argon (Ar) ions strike a source generating atoms that are deposited on a substrate as shown in FIG. 8. Positive argon ions may be accelerated toward the source by applying negative potential on the source. The distance from the target to the substrate is D and Ar pressure in the sputter chamber is p. Mobility of atoms deposited on the substrate is affected by the kinetic energy of the deposited atoms as well as the kinetic energy of Ar neutrals that strike the substrate surface. Ar ions that strike the target source receive an electron and bounce off the source as Ar neutrals. If these Ar neutrals strike the substrate surface they increase the mobility of the deposited atoms. High pressure in the sputtering chamber, p, will also increase the probability of collision between Ar neutrals and the rest of the Ar atoms in the chamber reducing $E_k$ of the Ar neutrals and reducing the effect of Ar neutrals on mobility of deposited atoms. In addition, a low negative voltage bias may be applied to the substrate to influence or further control surface mobility.

Figure 9:
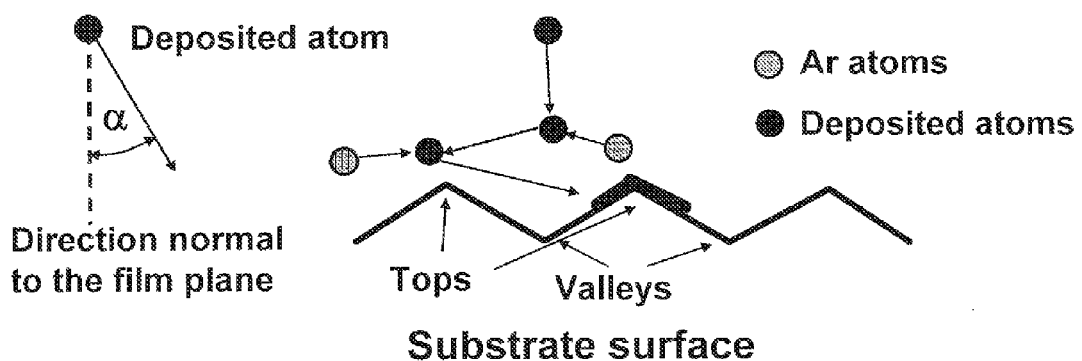
FIG. 9 is a diagram illustrating the deposition of adatoms on a substrate in a high-pressure, low mobility sputter deposition process.

Similarly, the kinetic energy, $E_k$, and angle, $\alpha$, (see FIG. 9) at which deposited atoms land on a substrate surface depend on Ar pressure in the sputtering chamber. If the pressure is high, the probability of collisions between deposited atoms and Ar atoms is larger resulting in a reduction of $E_k$(atoms) and an increase of $\alpha$ of the deposited atoms (see FIG. 9). In other words, these collisions alter the direction or angle at which atoms are deposited on the substrate surface. As FIG. 9 illustrates, $\alpha$ is an angle between the direction that is normal to the film plane and the direction of deposited atom. Without collisions with Ar atoms, the majority of atoms will be deposited at low $\alpha$ angles (i.e., closer to perpendicular to the substrate surface). Collisions increase the average deposition angle $\alpha$ resulting in reduced deposition rate in the valleys in comparison to the tops of the substrate surface.

As an example, a ruthenium (Ru) interlayer can be sputtered at high pressure 6 Pa (45 mTorr) of Ar on a seed layer. Sputtering at higher pressure reduces the mean free path of sputtered Ru atoms (and Ar neutrals reflected from a Ru target) due to collisions with Ar atoms on their path from target to substrate. The collisions reduce the kinetic energy of deposited Ru atoms reducing surface diffusion of Ru atoms, and randomize the angle at which Ru atoms are deposited onto the substrate away from the direction that is normal to film surface. This causes roughness to increase with increasing film thickness because the "tops" of neighboring column structures block the adatoms incident line-of-sight path to the "valleys". Thus, the sputtering rate in the "valleys" is lower than that on the "tops" of the rough area due to the shadowing effect. Continued growth under controlled sputtering conditions (such as low temperature and high pressure) therefore results in increasingly voided (physically separated) columnar structures.

Applying a similar sputtering process to a composite target of (or otherwise co-sputtering) a semiconductor and an oxide results in a similar structure. That is, the semiconductor atoms deposited on the substrate surface form columnar structures during the sputtering process, while the oxide material is dispersed by the semiconductor grain boundaries forming a matrix that surrounds or isolates the semiconductor grains.

While the semiconductor and oxide layer can be formed directly on an oxide or other layer, it can also be grown or sputter deposited on an interlayer, such as an Ru interlayer (as formed above), which induces or promotes vertical columnar growth in the semiconductor and oxide layer. That is, the interlayer can control the crystallographic growth orientation, grain diameter of semiconductor and most importantly surface roughness required for segregating oxide in grain boundaries. For example, co-sputtering of semiconductor and oxide, under high pressure, causes semiconductor grains to grow on top of the Ru grains with oxide segregating to semiconductor grain boundaries. In addition, a metal material may be added to the semiconductor and oxide layer to promote growth of the desired composition and microstructure of the semiconductor and oxide layer. The metal material may be at least one of the following materials: Al, Ti, V, Cr, Mn, Fe, Co, Ni, Cu, Zr, Nb, Mo, Ru, Rh, Pd, Pt, Ag, Hf, Ta, W, Re, Ir, and Au. The metal material may be embodied in a separate target and co-sputtered with semiconductor and oxide target(s) or be mixed into the same target.

Still further, after deposition of one or more semiconductor and oxide layers, the structure may be annealed in the presence of inert or reactive gasses to obtain desired composition, compound and crystal structures and/or to reduce defects. Annealing temperatures may vary up to 1000 degrees C.; however, annealing temperatures in the range of 140 to 600 degrees C. are preferred. After a given annealing step, the structure is preferably cooled if the next layer to be sputtered is also semiconductor and oxide layer.

In a particular implementation, the semiconductor and oxide layer can be formed using a magnetron sputtering in the presence of a gas, under one or more of the following sputtering conditions: 1) a total atmospheric pressure during sputtering of at least 0.7 Pa (5 mTorr); 2) an applied bias on a substrate during the sputtering of less than 400 V, and 3) a temperature of a substrate during the sputtering below 300 degrees C. Total atmospheric pressure in the chamber, $p_{tot}$, required to achieve the segregation of oxide to grain boundaries in the semiconductor and oxide layer depends on the distance from source to the substrate, D, and the deposition rate, DR, (the number of atoms that land on a substrate per second and can be also defined as a thickness of the deposited layer per second). As D increases, oxide segregation at semiconductor grain boundaries can be achieved with lower $p_{tot}$ pressure. If D increases the probability of collisions between deposited atoms and Ar atoms increases. On the other hand, as DR increases, $p_{tot}$ pressure has to be higher to lower the surface mobility of deposited atoms required for the oxide segregation. For example, if D=2 cm, and DR is larger than 1 nm/s, $p_{tot}$ pressure should be larger than 1.0 Pa (8 mTorr). If D=2 cm, and DR is larger than 5 nm/s, $p_{tot}$ pressure should be larger than 1.3 Pa (10 mTorr). If D=5 cm, and DR is larger than 1 nm/s, $p_{tot}$ pressure should be larger than 0.8 Pa (6 mTorr). If D=10 cm, and DR is larger than 1 nm/s, $p_{tot}$ pressure should be larger than 0.7 Pa (5 mTorr). If D=10 cm, and DR is larger than 5 nm/s, $p_{tot}$ pressure should be larger than 0.8 Pa (6 mTorr).

In some cases a negative bias can be applied to the substrate. The bias increases mobility of deposited atoms on the substrate surface. The semiconductor and oxide layer is sputtered with the bias that is less than 400 Volts (V). In many instances, the bias can be below 200 V. In addition, the semiconductor and oxide layer can be sputtered in the presence of at least one of the gasses argon (Ar), krypton (Kr) and xenon (Xe). The semiconductor and oxide layer can be sputtered in a reactive environment that, in addition to one or more of Ar, Kr and Xe, can also contain oxygen ($O_2$), nitrogen ($N_2$), hydrogen (H), hydrogen sulfide ($H_2S$), and hydrogen selenide ($H_2Se$). The semiconductor and oxide layer can be sputtered from a single target including both semiconductor and oxide materials, or co-sputtered at the same time from two or more different targets. The semiconductor and oxide layer can be also annealed in $CdCl_2$ vapors.

As mentioned above, in order to obtain surface roughness that can improve oxide segregation, an interlayer can be sputtered prior to sputtering the semiconductor and oxide layer. The presence of the interlayer can improve crystallographic growth of the semiconductor and oxide layer and narrow the diameter distribution of semiconductor grains. With reference to FIGS. 7a to 7c, to accomplish these objects, the interlayer 5000 may include one or more of the following sub-interlayer types: 1) interlayer 50m1 sets the growth for subsequently sputtered layers or improves growth of subsequently sputtered interlayers, 2) interlayer 50n2 sets desired growth orientation and grain size for subsequently sputtered layers, 3) interlayer 50r3 sets the surface roughness desired for growth of subsequently sputtered layers, such as a semiconductor and oxide layer 21xy. Each of the interlayers, 50m1, 50n2, and 50r3 may include up to 100 sub-layers (m, n, and r vary from 0 to 100). Interlayer 50 ml can be amorphous or crystalline. Second and third interlayers, 50n2 and 50n3, may be crystalline. FIGS. 7a and 7b illustrate different possible interlayer structures that can be formed. FIG. 7a and FIG. 7b show an interlayer 5000 that consists of interlayers 50m1, 50n2, and 50r3. Interlayers 50m1, 50n2, and 50r3 may include 1) one or more metallic layers, 2) one or more semiconductor layers, and/or 3) one or more oxide layers. Alternatively, FIG. 7c shows an interlayer 5000 that includes interlayers 50m1, 50n2, and 50r3 and one or more metal and oxide layer 2200. The total thickness of the interlayer 5000 may vary from one atomic monolayer to 0.1 mm, with a preferred range of 3 to 4000 nm.

Suitable metals for the interlayer 5000 or sub-interlayer types 50m1, 50n2, and 50r3, include Al, Ti, V, Cr, Mn, Fe, Co, Ni, Cu, Zr, Nb, Mo, Ru, Rh, Pd, Ag, Hf, Ta, W, Re, Pt, Ir, and Au. Suitable semiconductors for the interlayer 5000 or sub-interlayer types 50m1, 50n2, and 50r3, include Si, Ge, Sn, β-$FeSi_2$, InSb, InAs, InP, GaP, GaAs, GaSb, AlSb, SiC, Te, ZnSb, HgTe, PbS, PbSe, PbTe, CdS, CdSe, CdTe, ZnS, ZnSe, ZnTe, SnTe, $Cu_{1-x}S$ (x=1 to 2), $Cu_{1-x}Se$ (x=1 to 2), $CuInS_2$, $CuGaS_2$, $Cu(In_{1-x}Ga_x)S_2$ (x=0 to 1), $CuInSe_2$, $CuGaSe_2$, $Cu(In_{1-x}Ga_x)Se_2$ (x=0 to 1)), $(Cu_{1-x}Ag_x)(In_{1-y}Ga_y)S_2$ (x=0 to 1, y=0 to 1), $(Cu_{1-x}Ag_x)(In_{1-y}Ga_y)Se_2$ (x=0 to 1, y=0 to 1), $(Cu_{1-x}Ag_xAu_y)(In_{1-z}Ga_z)Se_2$ (x=0 to 1, y=0 to 1, z=0 to 1), $In_2S_3$, $In_2Se_3$, AlN, InN, GaN, $Bi_2S_3$, $Sb_2S_3$, $Ag_2S$, $WS_2$, $WSe_2$, $MoS_2$, $MoSe_2$, $SnS_x$ (x=1 to 2), $SnSe_x$ (x=1 to 2), $Cu_4SnS_4$. Suitable oxide materials for the interlayer 5000 or sub-interlayer types 50m1, 50n2, and 50r3, include magnesium (Mg) oxide, aluminum (Al) oxide, silicon (Si) oxide, titanium (Ti) oxide, vanadium (V) oxide, chromium (Cr) oxide, manganese (Mn) oxide, iron (Fe) oxide, cobalt (Co) oxide, nickel (Ni) oxide, copper (Cu) oxide, zinc (Zn) oxide, gallium (Ga) oxide, germanium (Ge) oxide, selenium (Se) oxide, yttrium (Y) oxide, zirconium (Zr) oxide, niobium (Nb) oxide, molybdenum (Mo) oxide, indium (In) oxide, tin (Sn) oxide, antimony (Sb) oxide, tellurium (Tl) oxide, hafnium (Hf) oxide, tantalum (Ta) oxide, tungsten (W) oxide, mercury (Hg) oxide, lead (Pb) oxide, and bismuth (Bi) oxide. The interlayers 5000 can sputtered with a magnetron sputtering technique. The sputtering conditions for 50m1 and 50n2 may comprise one or more of 1) a total atmospheric pressure below 2.4 Pa (18 mTorr), 2) and a substrate temperature of below 600 C. The sputtering conditions for 50m3 may comprise one or more of 1) a total atmospheric pressure above 0.7 Pa (5 mTorr), 2) applied bias to the substrate less then 400 V, 3) and a substrate temperature of below 300 C.) Sputtering can be performed in at least one of the gasses, Ar, Kr and Xe. Sputtering can be also performed in a reactive environment that also contains oxygen ($O_2$), nitrogen ($N_2$), hydrogen (H), hydrogen sulfide ($H_2S$), and hydrogen selenide ($H_2Se$). The interlayer can be subsequently annealed in an environment that contains argon (Ar), krypton (Kr), xenon (Xe), oxygen ($O_2$), nitrogen ($N_2$), hydrogen (H), hydrogen sulfide ($H_2S$), hydrogen selenide ($H_2Se$) and/or $CdCl_2$ vapors.

In order to further improve growth of the interlayer and therefore the semiconductor and oxide layer 21xy, electron conducting layer 10n0 and 10z0, or hole conducting layer 30r0 and 30v0, a seed layer 6000 can be sputtered on the substrate before sputtering the interlayer 5000 (see FIGS. 10c and 10d). The seed layer 6000 is comprised of at least one amorphous or nano-crystalline material selected from the group consisting of: chromium titanium ($Cr_{1-x}Ti_x$ (x varies from 0.1 to 0.9)), nickel tantalum ($Ni_{1-x}Ta_x$ (x varies from 0.1 to 0.9)), nickel niobium ($Ni_{1-x}Nb_x$ (x varies from 0.1 to 0.9)), cobalt tungsten ($Co_{1-x}W_x$ (x varies from 0.1 to 0.9)), cobalt tantalum ($Co_{1-x}Ta_x$ (x varies from 0.1 to 0.9)), nickel phosphorus ($Ni_{1-x}P_x$ (x varies from 0.1 to 0.9)), chromium tantalum ($Cr_{1-x}Ta_x$ (x varies from 0.1 to 1)), silicon nitride ($Si_3N_4$), iron cobalt chromium boron ($Fe_{1-x-y-z}Co_xCr_yB_z$ (z is larger than 0.1)), cobalt chromium zirconium tantalum ($Co_{1-x-y-z}Cr_xZr_yTa_z$ (y+z is larger than 0.08)). A method of manufacturing the semiconductor and oxide layer can comprise sputter depositing the seed layer 6000 with a magnetron sputtering technique at a total atmospheric pressure less than 2.4 Pa (18 mTorr) and a substrate temperature below 300 C, and then sputter depositing the interlayer 5000 as discussed above. The method may further comprise sputter depositing a semiconductor and oxide layer 21xy under conditions including a total atmospheric pressure of at least 0.7 Pa (5 mTorr), an applied substrate bias less than 400 V, and a substrate temperature below 300 C. The foregoing is only intended to be illustrative. Other process conditions can also be used.

Sputtering of seed layer 6000 can be performed in at least one of the gasses, Ar, Kr and Xe. Sputtering can be also performed in the reactive environment that also contains oxygen ($O_2$), nitrogen ($N_2$), hydrogen (H), hydrogen sulfide ($H_2S$), and hydrogen selenide ($H_2Se$) with a total sputtering pressure lower than 1.3 Pa (10 mTorr). During the sputtering of the seed layer 6000 a bias voltage may be applied to the substrate to increase mobility of deposited atoms while growing the seed layer to yield a smooth layer surface that promotes improved growth and structure of the interlayer 5000.

The preferred crystal structures for metallic interlayers are face center cubic (fcc) and hexagonal close-packed (hcp). Metallic interlayers may include interlayers with both fcc and hcp crystal structures. In this case the preferred growth orientation for fcc interlayers is <111> and for hcp interlayers is <0002>. For example, a metal interlayer structure may comprise a first crystalline layer of an fcc material with <111> growth orientation, and a second crystalline layer of an fcc material also with <111> growth orientation. In another example, a metal interlayer structure may comprise a first crystalline layer of an fcc material with <111> growth orientation, and a second crystalline layer of an hcp material with <0002> growth orientation. In yet another example, a metal interlayer structure may comprise a first crystalline layer of an hcp material with <0002> growth orientation and a second crystalline layer of an hcp material also with <0002> growth orientation. In some instances, a body center cubic (bcc) layer structure can be grown on top of a hcp or fcc layer structure. Furthermore, another fcc or hcp material may be grown on top of this bcc layer structure. In this case a possible growth orientation of fcc material is <111>, hcp material is <0002> and bcc material is <110>. To further improve growth of the interlayer the short range order and mean nearest neighbor atomic spacing in a seed layer and the nearest neighbor atomic spacing of an interlayer grown on top of the seed layer should be similar. The thickness of the seed layer may range from one atomic monolayer to 0.1 mm with a preferred thickness between 1 nm and 10000 nm, and a more preferred range between 3 nm to 2000 nm.

In a particular implementation, a conversion layer 80 may include, in overlying sequence, a seed layer, one or more metallic interlayers having an fcc or hcp crystal structure, and a semiconductor or oxide layer. Additional layers, such as one or more electron conducting material layers 10n0 (such as an oxide material or n-type semiconductor layer), one or more semiconductor and oxide layers 21xy, and/or one or more hole conducting material layers 30r0 (such as a p-type semiconductor layer), can be deposited over these layers. To increase efficiency of the conversion layer 80, it is desirable to form substantially ohmic contacts between the metallic interlayer and the semiconductor or oxide layer formed on the metallic interlayer. If the layer formed on the interlayer includes a p-type semiconductor with a high work function, a Schottky barrier could be formed between the metal and semiconductor. One possible way of achieving a substantially ohmic contact, and avoiding Schottky barriers, is to sputter a thin highly doped p-type semiconductor on top of the p-type semiconductor layer with the large work function. This creates a thin highly doped region that carriers can tunnel through. Another way to achieve an ohmic contact is to sputter a very low band semiconductor material, such as $Sb_2Te_3$, followed by a metal material, such as Molybdenum (Mo) or Tungsten (W). Yet another way to achieve ohmic contact is to sputter deposit a thin oxide layer on the interlayer, followed by a metal material layer, such as Mo and W.

A benefit of the high pressure sputtering processes described herein is the formation of semiconductor grains separated by an oxide matrix. This microstructure is desired in solar cells where semiconductor grains inject electrons in the conductive band of an oxide and/or an n-type semiconductor material, and inject holes in the valence band of a hole conducting material. Relaxation rates of hot carriers are very fast in bulk semiconductors. However, the rate can be slowed if semiconductor grain diameter is reduced below about 10 to 20 nm. This allows the extraction of hot carriers before they can relax to the band edge (and/or generation of two or more electron-hole pairs from a single photon), increasing the efficiency of the photon conversion in nanometer-sized semiconductor absorbers. The high pressure sputtering process can be used to produce semiconductor grains with the average diameter below 10 nm. The average semiconductor grain diameter can be controlled by varying one or more of 1) sputtering pressure of the seed layer, interlayer and/or the semiconductor and oxide layer, 2) the thickness of the seed layer and the interlayer, and 3) the ratio between the semiconductor and oxide volume fraction in the semiconductor and oxide layer. Furthermore, the shape of the semiconductor grains can be controlled using a high pressure sputtering process. By changing the semiconductor and oxide layer thickness, for example, the shape of the semiconductor grains can be varied from that of a thin to that of thick cylindrical like shape.

The high pressure sputtering method can also be used to create a composite semiconductor and oxide layer having multiple sub-layers, such as multiple intrinsic semiconductor and oxide layers 2100, 2110, and 2120 ("SOL sub-layer"). One or more characteristics of each semiconductor and oxide layer may be varied to achieve desired results, such as varying semiconductor grain diameter and height (achieved by varying the semiconductor and oxide layer thickness) to vary the resulting band gap energy of the semiconductor grains. For example, each SOL sub-layer may contain the same or different semiconductor materials. Each SOL sub-layer may contain the same or different oxide materials. In addition the ratio between the semiconductor and oxide volume fraction can be varied across the layers.

The described flexibility of the process is quite advantageous for solar cells because it allows varying the band gap energy, $E_g$, of semiconductor grains in each SOL sub-layer. For example, assume that intrinsic semiconductor and oxide absorption layers 2100, 2110, 2120 in a solar cell are disposed between an electron conducting layer 1000 and a hole conducting layer 3000 (see FIG. 2a). To increase efficiency of the solar cell, energy or band gap energy, $E_g$, of semiconductor grain size can be varied from a larger value in the top sub-layer 2120 to a smaller value in the bottom sub-layer 2100. Light enters the solar cell from the top so it has to pass through the semiconductor and oxide layers with wider band gap first in order to reach the semiconductor and oxide layers with narrower band gap. In this case wider band gap materials at the top filter out most of the high energy photons, while less energy photons pass through to smaller band gap materials below. The band gap energy can be varied between about 0.5 to 3 eV to capture or take advantage of a broader spectrum of light energy. The band gap energy, $E_g$, of semiconductor grains can be varied by changing the diameter and the height of the semiconductor grains in the SOL sub-layers and/or by changing the composition of the semiconductor grains. The band gap energy of each layer can be step-wise varied over a range of the solar spectrum to achieve a high-efficiency cell.

FIG. 6 illustrates a possible solar cell structure that may be constructed with the semiconductor and oxide layer(s), as well as seed layer 6000 and interlayer 5000, disposed between an electron conducting layer 1000 and a hole conducting layer 3000. Electric contacts (such as transparent conductive layers, metal grids and layers), non-reflective coatings, and/or protective layers can also be added to the layered structure of the solar cell as described above. Additional example solar cell structures are described below in Section C.

C. Example Cell Structures and Configurations

The following figures and description provide generalized representations for the possible structures and layer configurations of the conversion layer 80. For example, the layer compositions and locations can be configured to achieve p-n junctions, p-i-n junctions, as well as tandem solar cell configurations. In a p-n junction configuration, all layers on one side of the junction should be p-type, while all layers on the other side of the junction should be n-type. In a p-i-n junction configuration, the middle layers should be i-type, while the remaining layers disposed on either side of the i-type layers should either be p-type or n-type. In a tandem cell configuration, two or more p-n or p-i-n junction configurations are constructed on top of each other such that the light passes through the wider band gap energy layers to reach the narrower band gap energy layers. Both multiple-terminal (e.g., four-terminal for two p-n or p-i-n cell layers, six-terminal for three p-n or p-i-n cell layers, and so on) and two-terminal tandem cell configurations can be constructed. In two-terminal configurations, interconnecting layers of highly doped p- and n-type layers may be disposed between the p-n or p-i-n cell layers. In other multi-terminal configurations, each p-n or p-i-n cell layer has its own contact terminals that are used to extract power from each p-n or p-i-n cell independently. In tandem cell configurations, wider band gap energy materials at the top filter out most of the high energy photons, while less energy photons pass through to smaller band gap energy materials below.

Figure 2A:
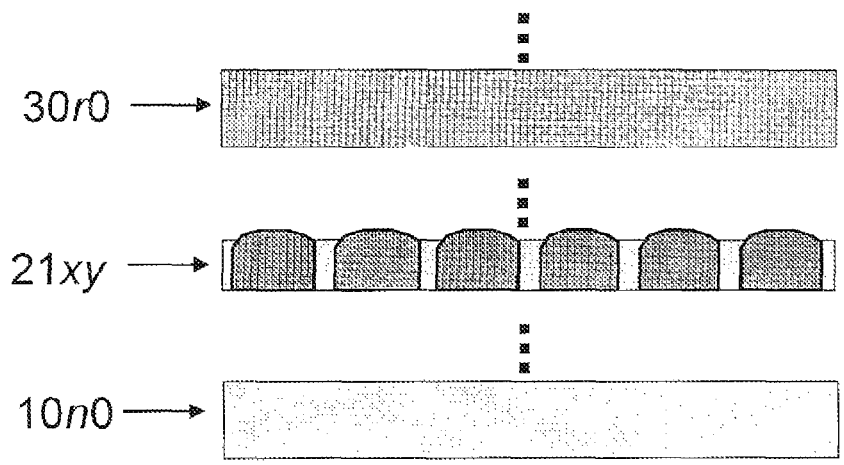
Figure 2B:
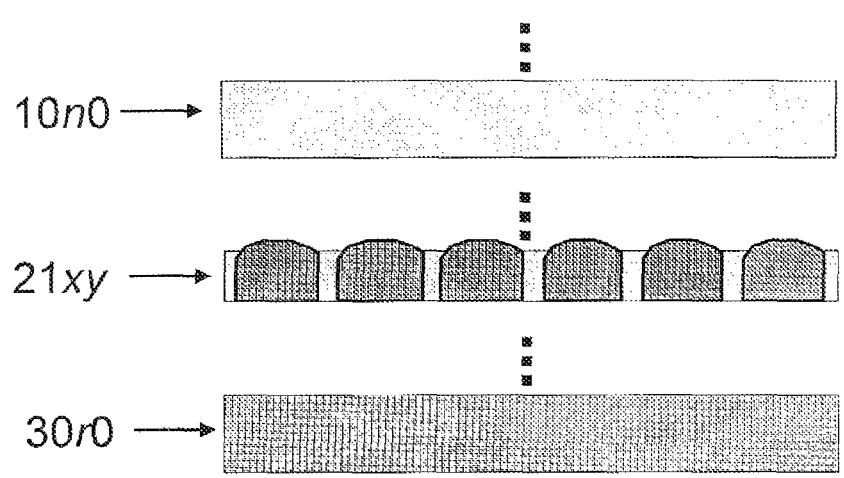
Figure 5A:
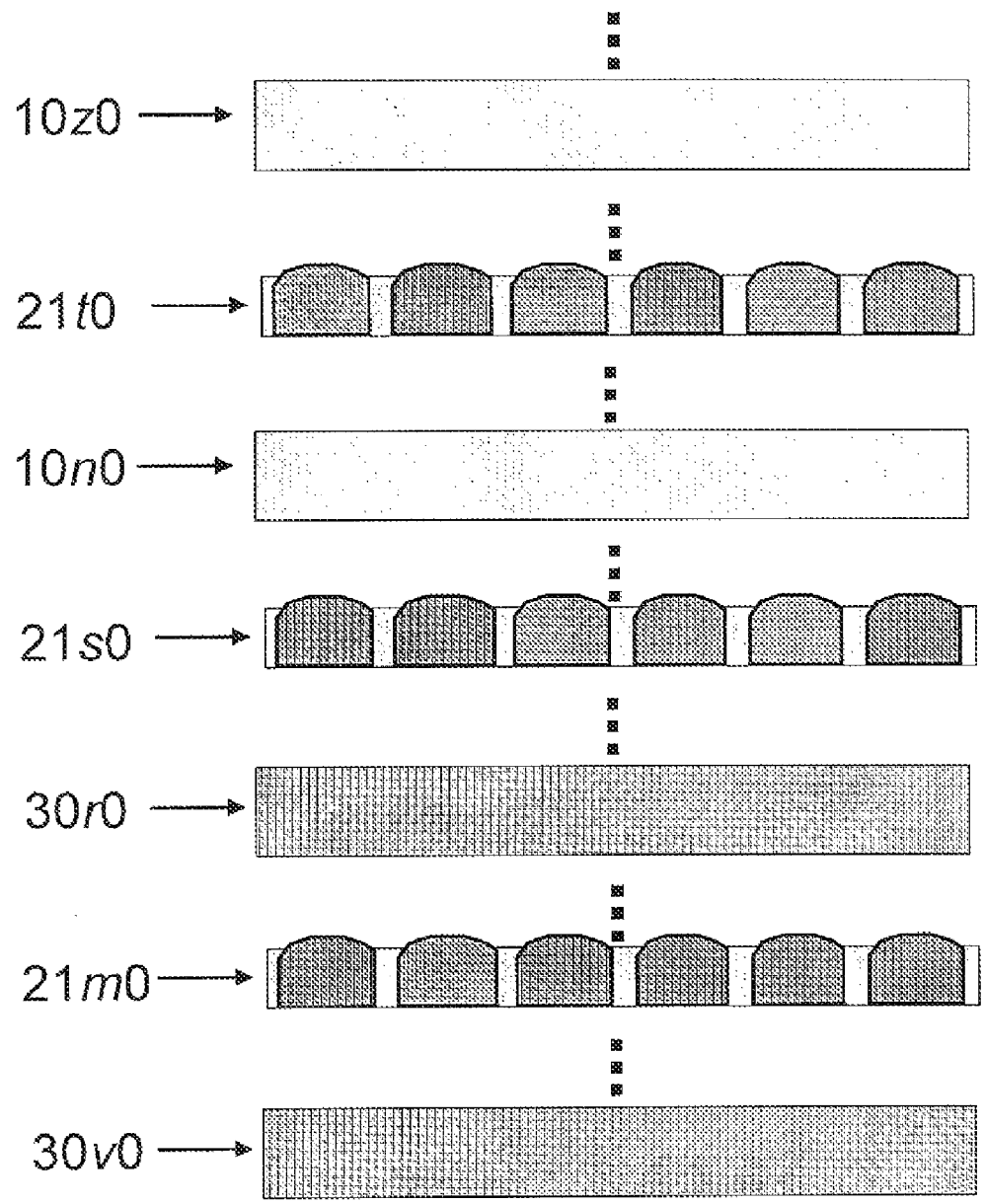

As FIGS. 2a to 2b provide, for example, the structure and composition of this composite photoactive conversion layer can be varied to achieve a vast array of different photovoltaic cell structures and configurations. FIG. 2a illustrates a composite photoactive conversion layer comprising, deposited in overlying sequence, one or more electron conducting material layers $10n0$ (such as an oxide material or n-type semiconductor layer), one or more semiconductor and oxide layers $21xy$, and one or more hole conducting material layers $30r0$ (such as a p-type semiconductor layer). As FIG. 2b illustrates, the composite photoactive conversion layer may be deposited in a reverse relation comprising, in overlying deposited sequence, one or more hole conducting material layers $30r0$, one or more semiconductor and oxide layers $21xy$, and one or more electron conducting material layers $10n0$. As discussed above, the variable identifiers x, r and n denote the layer number of a corresponding layer type. The maximum number of layers (X, R and N) can individually vary between 1 and 100.

Electron conducting material layer $10n0$, semiconductor and oxide layer $21xy$, and hole conducting material layer $30r0$ are, relative to the solar cells shown in FIGS. 1a to 1c, a composite photoactive conversion layer 80 that can be configured to produce a photovoltaic effect in response to solar energy. Semiconductor and oxide layer $21xy$, in some implementations, is a sensitizing or absorber layer disposed between hole conducting material layer $30r0$ and an electron conducting material layer $10n0$. In some implementations, upon photo excitation, electrons are efficiently injected from the conducting band of the semiconductor grains of semiconductor and oxide layer $21xy$ into the conducting band of electron conducting material layer $10n0$, creating a charge separation and producing photovoltaic effect. Regeneration of the absorber semiconductor grains can occur by capture of electrons from the hole conducting material layer $30r0$. In some implementations, upon photo excitation, holes travel from the valence band of the semiconductor grains of semiconductor and oxide layer $21xy$ into the valence band of hole conducting material layer $10n0$, creating a charge separation and producing photovoltaic effect. Holes are regenerated from the electron conducting material layer $10n0$. To that end, the material composition of the semiconductor and oxide layers can be configured in a variety of manners. For example, as discussed above, the composition of the semiconductor and oxide layers can be arranged to achieve a p-n or p-i-n junction configuration. In a particular implementation, and with reference to FIG. 2a, a first n-type semiconductor and oxide layer 2111 can be deposited over the electron conducting material layers $10n0$, a second i-type semiconductor and oxide layer 2120 can be deposited on the first semiconductor and oxide layer 2111, while a third p-type semiconductor and oxide layer 2132 can be deposited on the second semiconductor and oxide layer 2120. In addition, multiple semiconductor and oxide layers of the same material type may be deposited adjacently to one another. Furthermore, semiconductor grain size, as well as thickness, of the various semiconductor and oxide layers can be varied to achieve desired effects.

FIG. 3a shows conversion layer 80 structure according to which is deposited in overlying sequence, one or more oxide material or n-type semiconductor layers $10n0$, and one or more semiconductor and oxide layers $21xy$, where at least one of the semiconductor and oxide layers is a p-type semiconductor and oxide layer $21x2$. Prior to the first p-type semiconductor and oxide layer $21x2$, intrinsic and n-type semiconductor and oxide layers, as well as other continuous layers, can be deposited. FIG. 3b shows another embodiment of conversion layer 80 including one or more hole conducting material layers $30r0$, on which is deposited one or more semiconductor and oxide layers $21xy$, where at least one of the semiconductor and oxide layers is a n-type semiconductor and oxide layer $21x1$.

In other embodiments, continuous layers can be deposited on semiconductor and oxide layers. As FIG. 3c illustrates, a conversion layer 80 may comprise, in overlying sequence, one or more semiconductor and oxide layers $21xy$, where at least one of the semiconductor and oxide layers is a p-type semiconductor and oxide layer, and one or more oxide material or n-type semiconductor layers $10n0$. As FIG. $3d$ shows, conversion layer 80 may comprise, in overlying sequence, one or more semiconductor and oxide layers $21xy$, where at least one of the semiconductor and oxide layers is a n-type semiconductor and oxide layer, and one or more hole conducting material layers $30r0$.

FIG. $4a$ illustrates a conversion layer 80 comprising two or more semiconductor and oxide layers $210y$ and $21xy$, where at least one semiconductor and oxide layer is a p-type semiconductor and oxide layer and at least one semiconductor and oxide layer is an n-type semiconductor and oxide layer. FIG. $4b$ shows a conversion layer that includes, in overlying sequence, one or more semiconductor and oxide layers $21m0$, one or more hole conducting material layers $30r0$, one or more semiconductor and oxide layers $21s0$, one or more electron conducting material layers $10n0$, and one or more semiconductor and oxide layers $21t0$. In one implementation, the number of semiconductor and oxide layers M, S, T may vary from 0 to 100 where $M+S+T \geqq 1$. The number of continuous material layers R and N may also vary from 1 to 100. As FIG. $4c$ illustrates, the sequence of layer types can also vary such that the one or more hole conducting material layers $30r0$ overlie the one or more electron conducting material layers, $10n0$. As described above, for example, m equals a layer number from 1 to M (where M equals the number of layers). The same convention stands for the variables n, r, t, v, and z used in identifying the layers.

Still further, as FIGS. $5a$ and $5b$ illustrate, semiconductor and oxide layers can also be deposited to interpose continuous material layers of the same type. As FIG. $5a$ illustrates, a conversion layer may include, in overlying sequence, one or more hole conducting material layers $30v0$, one or more semiconductor and oxide layers $21m0$, one or more hole conducting material layers $30r0$, one or more semiconductor and oxide layers $21s0$, one or more electron conducting material layers $10n0$, one or more semiconductor and oxide layers $21t0$, and one or more one or more electron conducting material layers $10z0$. In one implementation, the number of semiconductor and oxide layers M, S, T may vary from 0 to 100 where $M+S+T \geqq 1$. The number of continuous material layers R and V may also vary from 0 to 100 where $R+V \geqq 1$. Similarly, the number of continuous material layers N and Z may also vary from 0 to 100 where $N+Z \geqq 1$.

FIGS. $10a$ and $10b$ illustrate other implementations of the invention that include additional material layer types. FIG. $10a$ illustrates a conversion layer configuration that includes, in overlying sequence, one or more semiconductor and oxide layers $21m0$, one or more metal and oxide layers $22g0$, one or more electron conducting material layers $10z0$, one or more metal and oxide layers $22h0$, one or more semiconductor and oxide layers $21s0$, one or more metal and oxide layers $22i0$, one or more hole conducting material layers $30v0$, one or more metal and oxide layers $22j0$, one or more semiconductor and oxide layers $21t0$, and one or more metal and oxide layers $22k0$. FIG. $10b$ illustrates a configuration where the continuous material layers (hole conducting material layers $30v0$ and electron conducting material layers $10z0$) are reversed relative to FIG. $10a$. The number of metal and oxide layers G,H,I,J,K may vary from 0 to 100 where and $G+H+I+J+K \geqq 1$. Similarly, the number of semiconductor and oxide layers M,S,T vary from 0 to 100 where $M+S+T \geqq 1$. The number of continuous material layers V and Z may vary from 0 to 100. If $V+Z$ is O, then $M+S+T \geqq 2$ and at least one semiconductor and oxide layer is n-type and at least another semiconductor and oxide layer is p-type. If Z is O and V>0 at least one semiconductor and oxide layer is n-type. If V is 0 and Z>0 at least one semiconductor and oxide layer is p-type.

FIG. $11a$ provides a cell structure in which are deposited, in overlying sequence, an oxide material or n-type semiconductor layer 1000, two or more semiconductor and oxide layers (2100, 2110, . . . $21n0$), and p-type semiconductor or other hole conducting material layer 3000. The composition of semiconductor material in layers 2100, 2110, . . . , $21n0$ can be varied to vary the band gap energy of semiconductor material and increase efficiency of the solar cell. For example, the semiconductor of layer 2100 can be different from the semiconductor of layer 2110. Layers 1000, 2100, 2110, . . . , $21n0$ can be deposited with a magnetron sputtering technique at a total atmospheric pressure of at least 1 Pa (8 mTorr). Layer 1000 can be also first sputtered at a total atmospheric pressure below 0.8 Pa (6 mTorr) and then sputtered at a total atmospheric pressure above 1 Pa (8 mTorr) to achieve required surface roughness for subsequently sputtering semiconductor and oxide layers 2100, 2110, . . . , $21n0$. Layer 3000 can be sputtered at a total atmospheric pressure below 1.8 Pa (15 mTorr). Other sputter process conditions can be used. In some implementations, at least one of the semiconductor and oxide layers 2100, 2110 . . . $21n0$ may contain gold (Au).

FIG. $11b$ shows a cell structure in which are deposited, in overlying sequence, an oxide material or n-type semiconductor layer 1000, two or more semiconductor and oxide layers 2100, 2110, . . . , $21n0$, a p-type semiconductor or other hole conducting material 3000. The size (diameter and/or height) of semiconductor grains in layers 2100, 2110, . . . , $21n0$ can be varied to vary the band gap energy of semiconductor material and increase photovoltaic efficiency of this structure. In a particular implementation, the size of the semiconductor grains in the first layer 2100 is the largest (relative to all other semiconductor and oxide layers), with semiconductor grain size decreasing with each successive layer. Layers 1000, 2100, 2110, . . . , $21n0$ can be deposited with a magnetron sputtering technique at a total atmospheric pressure of at least 1 Pa (8 mTorr). Layer 1000 can be also first sputtered at a total atmospheric pressure below 0.8 Pa (6 mTorr) and then sputtered at a total atmospheric pressure above 1 Pa (8 mTorr). Layer 3000 can sputtered at a total atmospheric pressure below 1.8 Pa (15 mTorr) to achieve a desired surface roughness for subsequently sputtering semiconductor and oxide layers 2100, 2110, . . . , $21n0$. Similarly, FIG. $11c$ illustrates a cell structure in which are deposited, in overlying sequence, an oxide material or n-type semiconductor layer 1000, two or more semiconductor and oxide layers 2100, 2110, . . . , $21n0$, a p-type semiconductor or other hole conducting material 3000. The size of the semiconductor grains and the composition of the semiconductor grains in layers 2100, 2110, . . . , $21n0$ can be varied to vary the band gap energy of semiconductor material and increase photovoltaic efficiency. As FIGS. $11a$-$c$ show, an intervening layer (3500, 3510, . . . , $35(n+1)0$), such as a thin layer of oxide, may be deposited between each of the semiconductor and oxide layers 2100, 2110, . . . , $21n0$ to isolate the semiconductor grains as shown. The thickness of layers 3500, 3510, . . . , $35(n+1)0$ can be below 10 nm. In one implementation, the thickness of layers 3500, 3510, . . . , $35(n+1)0$ is below 4 nm.

Figure 11A:
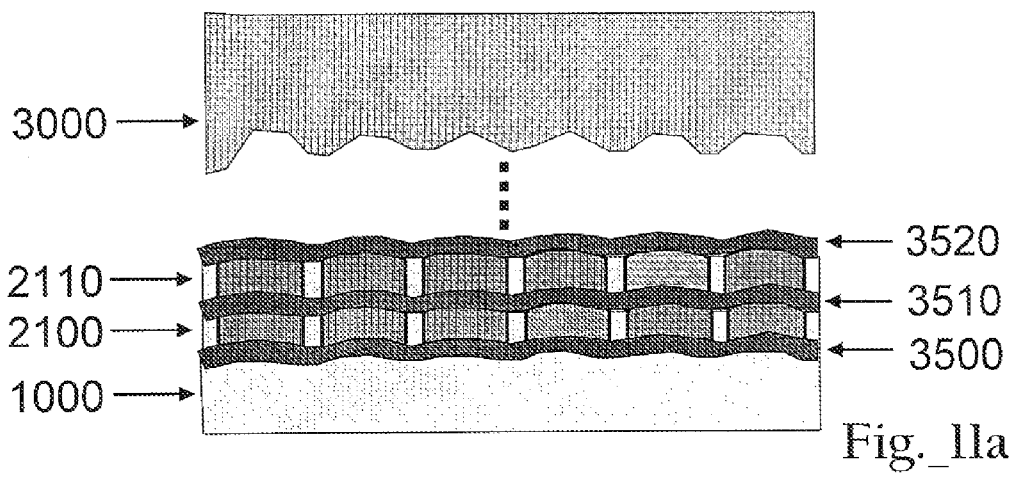
Figure 11B:
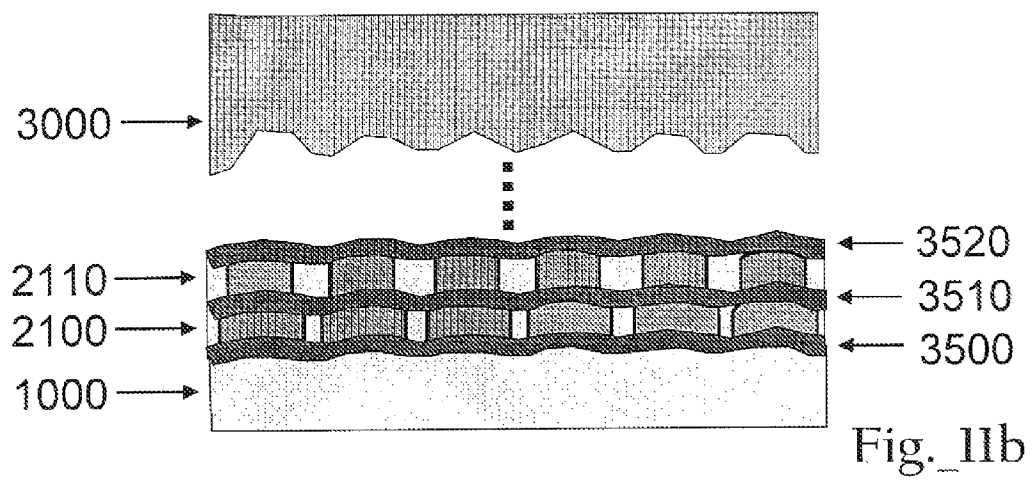
Figure 11C:
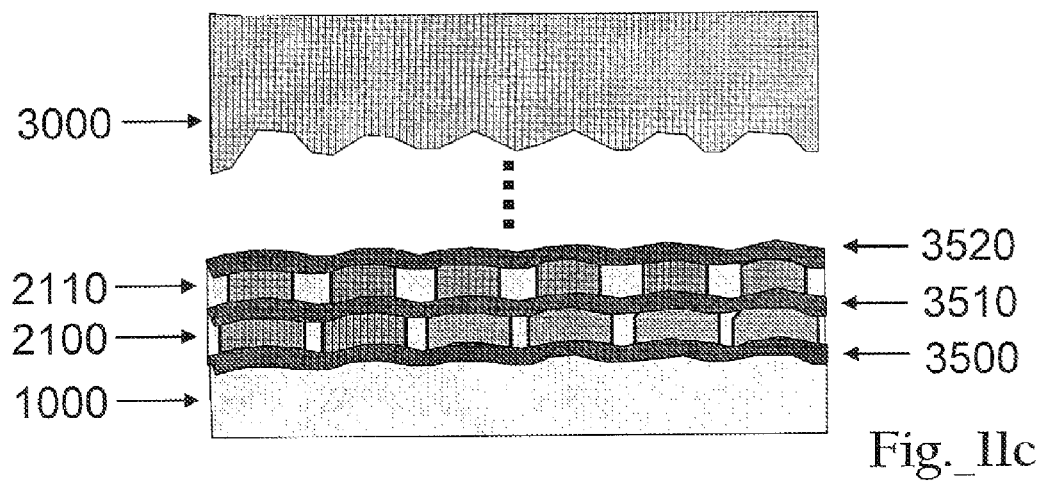
Figure 11D:
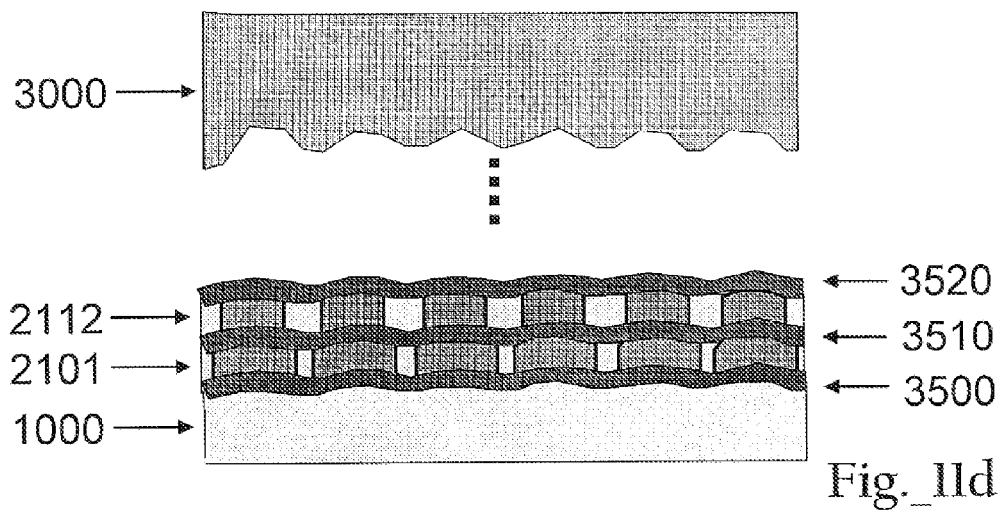
Figure 11E:
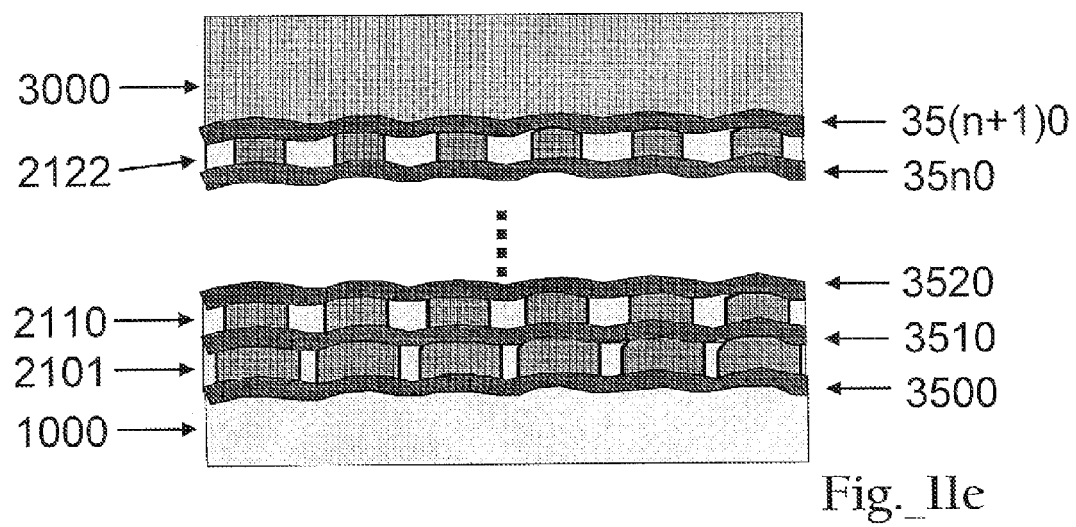

In some particular implementations, solar cell structures including semiconductor and oxide layers where the semiconductor material (or grain) is a p-type semiconductor or an n-type semiconductor can also be constructed. FIG. $11d$, for example, illustrates, a cell structure in which are deposited, in overlying sequence, an oxide material or n-type semiconductor layer 1000, n-type semiconductor and oxide layer 2101, p-type semiconductor and oxide layer 2112, and semiconductor or other hole conducting material layer 3000. The layered structure includes n-type semiconductor and oxide layer 2101 and p-type semiconductor and oxide layer 2112 can be repeated n times between n-type semiconductor layer 1000 and hole conducting material layer 3000. Intervening layer (3500, 3510, . . . , 35(*n*+1)0), such as a thin layer of oxide, may be deposited between each of the semiconductor and oxide layers 2101 and 2112 and between semiconductor and oxide layer and layers 1000 and 3000. Seed layers and interlayers may also be disposed between layer 1000 and n-type semiconductor and oxide layer 2101. In addition, one or more intrinsic semiconductor and oxide layers 2110 (see FIG. 11*e*) can be disposed between the n-type semiconductor and oxide layer 2101 and p-type semiconductor and oxide layer 2122. In any of the foregoing configurations, an intervening layer (3500, 3510, . . . , 35(*n*+1)0), such as a thin layer of oxide, may be deposited between each of the semiconductor and oxide layers 2101, 2110, . . . , 2112 to isolate the semiconductor grains as shown in FIGS. 11*d*, and 11*e*. The size (diameter and/or height) and/or composition of the semiconductor grains of one or more of these semiconductor and oxide layers 2101, 2110, 2112, etc. can be varied to vary band gap energy of semiconductor material and increase photovoltaic efficiency.

In the previous description, numerous specific details are set forth, such as specific materials, structures, processes, etc., in order to provide a better understanding of the present invention. However, the present invention can be practiced without resorting to the details specifically set forth. In other instances, well-known processing materials and techniques have not been described in detail in order not to unnecessarily obscure the present invention. Only the preferred embodiments of the present invention and but a few examples of its versatility are shown and described in the present disclosure. It is to be understood that the present invention is capable of use in various other combinations and is susceptible of changes and/or modifications within the scope of the inventive concept as expressed herein.

What is claimed is:

1. A photovoltaic cell, comprising:
    one or more overlying electron-conducting layers each comprising one or more electron-conducting materials;
    one or more overlying hole-conducting layers each comprising one or more hole-conducting materials; and
    a plurality of photoactive conversion layers, each of the overlying photoactive conversion layers being disposed between the one or more overlying electron-conducting layers and the one or more overlying hole-conducting layers, each of the photoactive conversion layers comprising one or more distinct overlying semiconductor and oxide layers, each semiconductor and oxide layer comprising a multiplicity of semiconductor grains arranged in a distinct oxide matrix, wherein each of the semiconductor grains is substantially columnar, wherein each of the semiconductor grains has a height substantially equal to that of a thickness of the respective distinct semiconductor and oxide layer, and wherein the oxide matrix is dispersed at least at circumferential grain boundaries of the semiconductor grains;
    wherein in one or more of the photoactive conversion layers, the volumes of one or more of the semiconductor grains in one or more of the respective distinct semiconductor and oxide layers are different in the respective photoactive conversion layer resulting in different bandgaps of each of one or more of the distinct semiconductor and oxide layers in the respective photoactive conversion layer.

2. The photovoltaic cell of claim 1, wherein in one or more of the photoactive conversion layers, the material compositions of one or more of the semiconductor grains in one or more of the respective semiconductor and oxide layers are different in the respective photoactive conversion layer resulting in different bandgaps of each of one or more of the semiconductor and oxide layers of different material compositions in the respective photoactive conversion layer.

3. The photovoltaic cell of claim 1, wherein in two or more of the photoactive conversion layers, the material compositions of one or more of the semiconductor grains in the semiconductor and oxide layers are different in the two or more respective photoactive conversion layers resulting in different bandgaps of each of the two or more respective photoactive conversion layers.

4. The photovoltaic cell of claim 1, wherein in two or more of the photoactive conversion layers, the volumes of one or more of the semiconductor grains in the semiconductor and oxide layers are different in the two or more respective photoactive conversion layers resulting in different bandgaps of each of the two or more respective photoactive conversion layers.

5. The photovoltaic cell of claim 1, wherein one or more of the overlying electron-conducting layers each comprises a continuous n-type semiconductor layer or a metallic layer, wherein each of the continuous n-type semiconductor layers or metallic layers is substantially uniform in thickness.

6. The photovoltaic cell of claim 1, wherein one or more of the overlying hole-conducting layers each comprises a continuous p-type semiconductor layer or a metallic layer, wherein each of the continuous p-type semiconductor layers or metallic layers is substantially uniform in thickness.

7. The photovoltaic cell of claim 1, wherein one or more of the overlying photoactive conversion layers comprises one or more overlying intrinsic semiconductor and oxide layers, each intrinsic semiconductor and oxide layer comprising a multiplicity of intrinsic semiconductor grains arranged in an oxide matrix, wherein each of the intrinsic semiconductor grains is substantially columnar, wherein each of the intrinsic semiconductor grains has a height substantially equal to that of a thickness of the respective intrinsic semiconductor and oxide layer, and wherein the oxide matrix is dispersed at least at circumferential grain boundaries of the intrinsic semiconductor grains.

8. The photovoltaic cell of claim 1, wherein one or more of the overlying photoactive conversion layers comprises:
    one or more overlying n-type semiconductor and oxide layers, each n-type semiconductor and oxide layer comprising a multiplicity of n-type semiconductor grains arranged in an oxide matrix, wherein each of the n-type semiconductor grains is substantially columnar, wherein each of the n-type semiconductor grains has a height substantially equal to that of a thickness of the respective n-type semiconductor and oxide layer, and wherein the oxide matrix is dispersed at least at circumferential grain boundaries of the n-type semiconductor grains; and/or
    one or more overlying p-type semiconductor and oxide layers, each p-type semiconductor and oxide layer comprising a multiplicity of p-type semiconductor grains arranged in an oxide matrix, wherein each of the p-type semiconductor grains is substantially columnar, wherein each of the p-type semiconductor grains has a height substantially equal to that of a thickness of the respective p-type semiconductor and oxide layer, and wherein the oxide matrix is dispersed at least at circumferential grain boundaries of the p-type semiconductor grains.

9. The photovoltaic cell of claim 8, wherein the semiconductor and oxide layer most closely disposed in proximity to the one or more electron-conducting layers is one of the one or more n-type semiconductor and oxide layers and the semiconductor and oxide layer most closely disposed in proximity to the one or more hole-conducting layers is one of the one or more p-type semiconductor and oxide layers.

10. The photovoltaic cell of claim 8, further comprising one or more metal and oxide layers, each of the one or more metal and oxide layers being disposed between the one or more overlying electron-conducting layers and the one or more overlying hole-conducting layers, each of the metal and oxide layers comprising a multiplicity of metallic grains arranged in an oxide matrix, wherein each of the metallic grains is substantially columnar, wherein each of the metallic grains has a height substantially equal to that of a thickness of the respective metal and oxide layer, and wherein the oxide matrix is dispersed at least at circumferential grain boundaries of the metallic grains.

11. The photovoltaic cell of claim 10, wherein one or more of the metal and oxide layers are disposed between:
the one or more overlying n-type semiconductor and oxide layers and the one or more overlying p-type semiconductor and oxide layers within a respective photoactive conversion layer;
adjacent ones of the one or more photoactive conversion layers;
the one or more overlying electron-conducting layers and the one of the one or more photoactive conversion layers most closely disposed in proximity to the one or more overlying electron-conducting layers; and/or
the one or more overlying hole-conducting layers and the one of the one or more photoactive conversion layers most closely disposed in proximity to the one or more overlying hole-conducting layers.

12. The photovoltaic cell of claim 11, wherein each of substantially most or all of the metallic semiconductor grains in one or more of the metal and oxide layers is in contact on one end with a p-type semiconductor grain from an adjacent p-type semiconductor and oxide layer.

13. The photovoltaic cell of claim 11, wherein each of substantially most or all of the metallic semiconductor grains in one or more of the metal and oxide layers is in contact on one end with an n-type semiconductor grain from an adjacent n-type semiconductor and oxide layer.

14. The photovoltaic cell of claim 8, wherein:
each of the one or more overlying photoactive conversion layers is separated from an adjacent one of the one or more overlying photoactive conversion layers by an electrically conductive interconnecting layer;
one or more overlying n-type semiconductor and oxide layers and the one or more overlying p-type semiconductor and oxide layers within one or more respective photoactive conversion layer are separated by an electrically conductive interconnecting layer;
one or more of the overlying n-type semiconductor and oxide layers within a respective photoactive conversion layer are separated from an adjacent one of the n-type semiconductor and oxide layers within the respective photoactive conversion layer by an electrically conductive interconnecting layer; and/or
one or more of the overlying p-type semiconductor and oxide layers within a respective photoactive conversion layer are separated from an adjacent one of the p-type semiconductor and oxide layers within the respective photoactive conversion layer by an electrically conductive interconnecting layer.

15. The photovoltaic cell of claim 14, wherein the interconnecting layer comprises one or more layers each of which comprises one or more of a conductive oxide, a transparent conductive oxide, an intrinsic semiconductor layer, an intrinsic semiconductor and oxide layer, an n-type semiconductor layer, a p-type semiconductor layer, a metallic layer, an electron-conducting layer, or a hole-conducting layer.

16. The photovoltaic cell of claim 8, wherein:
one or more of the overlying photoactive conversion layers is separated from an adjacent one of the one or more overlying photoactive conversion layers by a semiconductor grain-isolating intervening layer;
one or more overlying n-type semiconductor and oxide layers and the one or more overlying p-type semiconductor and oxide layers within one or more respective photoactive conversion layer are separated by a semiconductor grain-isolating intervening layer within the respective photoactive conversion layer;
one or more of the overlying n-type semiconductor and oxide layers within a respective photoactive conversion layer are separated from an adjacent one of the n-type semiconductor and oxide layers within the respective photoactive conversion layer by a semiconductor grain-isolating intervening layer; and/or
one or more of the overlying p-type semiconductor and oxide layers within a respective photoactive conversion layer are separated from an adjacent one of the p-type semiconductor and oxide layers within the respective photoactive conversion layer by a semiconductor grain-isolating intervening layer.

17. The photovoltaic cell of claim 16, wherein one or more of the intervening layers is comprised of a non-conductive oxide.

18. The photovoltaic cell of claim 1, further comprising a substrate;
wherein:
the one or more overlying electron-conducting layers are deposited over the substrate;
the one or more photoactive conversion layers are deposited over the one or more overlying electron-conducting layers, and
the one or more overlying hole-conducting layers are deposited over the one or more photoactive conversion layers; or
wherein:
the one or more overlying hole-conducting layers are deposited over the substrate;
the one or more photoactive conversion layers are deposited over the one or more overlying hole-conducting layers, and
the one or more overlying electron-conducting layers are deposited over the one or more photoactive conversion layers.

19. The photovoltaic cell of claim 18, further comprising one or more electrically conducting interlayers, wherein:
one or more of the electrically conducting interlayers are disposed between the one or more overlying electron-conducting layers and the one of the one or more photoactive conversion layers most closely disposed in proximity to the one or more overlying electron-conducting layers;
one or more of the electrically conducting interlayers are disposed between the one or more overlying hole-conducting layers and the one of the one or more photoactive conversion layers most closely disposed in proximity to the one or more overlying hole-conducting layers;

one or more of the electrically conducting interlayers are disposed between the one or more overlying electron-conducting layers and the substrate; and/or one or more of the electrically conducting interlayers are disposed between the one or more overlying hole-conducting layers and the substrate.

20. The photovoltaic cell of claim 19, wherein one or more of the interlayers promotes vertical columnar growth of the semiconductor or metallic grains in the respective semiconductor and oxide layer or metal and oxide layer adjacent the one or more interlayers.

21. The photovoltaic cell of claim 19, wherein one or more of the interlayers is configured to control the crystallographic growth orientation, grain diameter, or surface roughness of the semiconductor or metallic grains in the respective semiconductor and oxide layer or metal and oxide layer immediately adjacent the one or more interlayers.

22. The photovoltaic cell of claim 19, wherein one or more of the interlayers each comprise one or more metals or metallic materials.

23. The photovoltaic cell of claim 19, further comprising one or more seed layers disposed between one or more of the interlayers and the substrate, the one or more seed layers promoting growth in the one or more of the interlayers.

24. The photovoltaic cell of claim 1, further comprising a transparent conductive layer disposed over the one or more electron-conducting layers on a side opposite the one or more photoactive conversion layers or disposed over the one or more hole-conducting layers on a side opposite the one or more photoactive conversion layers.

25. The photovoltaic cell of claim 24, further comprising a transparent protective layer formed over the transparent conductive layer on side opposite the one or more photoactive conversion layers.

26. The photovoltaic cell of claim 8, wherein there are a plurality of n-type semiconductor and oxide layers in one or more of the photoactive conversion layers, and wherein each of substantially most or all of the n-type semiconductor grains in one of the n-type semiconductor and oxide layers in a respective photoactive conversion layer is positioned over a corresponding n-type semiconductor grain in an immediately adjacent one of the n-type semiconductor and oxide layers in the respective photoactive conversion layer.

27. The photovoltaic cell of claim 8, wherein there are a plurality of p-type semiconductor and oxide layers in one or more of the photoactive conversion layers, and wherein each of substantially most or all of the p-type semiconductor grains in one of the p-type semiconductor and oxide layers in a respective photoactive conversion layer is positioned over a corresponding p-type semiconductor grain in an immediately adjacent one of the p-type semiconductor and oxide layers in the respective photoactive conversion layer.

28. The photovoltaic cell of claim 15, wherein each of substantially most or all of the intrinsic semiconductor grains in a particular interconnecting layer is in contact on one end with a p-type semiconductor grain from an adjacent p-type semiconductor and oxide layer and in contact on the other end with an n-type semiconductor grain from an adjacent n-type semiconductor and oxide layer.

29. The photovoltaic cell of claim 1, wherein the thickness of one or more of the semiconductor and oxide layers in one or more of the conversion layers is greater than an average grain diameter of the semiconductor grains in the respective semiconductor and oxide layer.

30. The photovoltaic cell of claim 29, wherein the thickness of one or more of the semiconductor and oxide layers in one or more of the conversion layers is greater than an average grain diameter of the semiconductor grains in the respective semiconductor and oxide layer by a factor of 10 or more.

* * * * *